(12) United States Patent
Huynh et al.

(10) Patent No.: US 6,927,613 B2
(45) Date of Patent: Aug. 9, 2005

(54) CIRCUIT GENERATING CONSTANT NARROW-PULSE-WIDTH BIPOLARITY CYCLE MONOCYCLES USING CMOS CIRCUITS

(75) Inventors: Phuong T. Huynh, Annandale, VA (US); Agustin Ochoa, Vista, CA (US); John McCorkle, Vienna, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 10/235,844

(22) Filed: Sep. 6, 2002

(65) Prior Publication Data

US 2003/0090308 A1 May 15, 2003

Related U.S. Application Data

(60) Provisional application No. 60/317,496, filed on Sep. 7, 2001, and provisional application No. 60/317,497, filed on Sep. 7, 2001.

(51) Int. Cl.[7] .............................................. H03K 13/02
(52) U.S. Cl. ....................... 327/172; 327/175; 327/291; 327/299
(58) Field of Search ................................ 327/172, 173, 327/174, 175, 291, 298, 299

(56) References Cited

U.S. PATENT DOCUMENTS

| | | | |
|---|---|---|---|
| 5,270,580 A | * 12/1993 | Nguyen | 327/295 |
| 5,311,150 A | 5/1994 | Engbretson et al. | 250/222.1 |
| 5,491,441 A | * 2/1996 | Goetschel et al. | 327/291 |
| 5,677,927 A | 10/1997 | Fullerton | 375/130 |
| 5,705,946 A | * 1/1998 | Yin | 327/333 |
| 6,351,246 B1 | 2/2002 | McCorkle et al. | 343/795 |
| 6,505,032 B1 | 1/2003 | McCorkle et al. | 455/41 |
| 6,700,939 B1 | 3/2004 | McCorkle et al. | 375/295 |

FOREIGN PATENT DOCUMENTS

| | | |
|---|---|---|
| EP | 1 083 669 A1 | 3/2001 |
| WO | WO 00/54420 | 9/2000 |
| WO | WO 01/93441 A1 | 12/2001 |
| WO | WO 02/0311998 A3 | 4/2002 |

OTHER PUBLICATIONS

Patent Abstracts of Japan—Publication No. 02116214, Apr. 27, 1990.
Patent Abstracts of Japan—Publication No. 60009215, Jan. 18, 1985.

(Continued)

*Primary Examiner*—Timothy P. Callahan
*Assistant Examiner*—An T. Luu
(74) *Attorney, Agent, or Firm*—Posz & Bethards, PLC

(57) ABSTRACT

A mono-cycle generating circuit includes a multiplexer, a pulse generating circuit, and a buffer circuit. The multiplexer receives data of a logical 1 or a logical 0, determines whether to generate a positive mono-cycle or a negative mono-cycle, based upon the data, and outputs clock signals varying in time based upon the data. The pulse generating circuit is coupled to the multiplexer, receives the clock signals and generates a first series of pulses including an up-pulse preceding a down-pulse, or a second series of pulses including a down-pulse preceding an up-pulse, in response to the clock signals received by the multiplexer. The buffer circuit is coupled to the pulse generating circuit and includes a switch circuit and a common mode buffer. The switch circuit generates the positive mono-cycle or the negative mono-cycle, based upon whether the first series of pulses is received from the pulse generating circuit or the second series of pulses is received from the pulse generating circuit. The common mode buffer circuit is coupled to the switching circuit and reduces noise generated by the switch circuit.

16 Claims, 25 Drawing Sheets

OTHER PUBLICATIONS

M.Z. Win et al., "Ultra–Wide Bandwidth Time–Hopping Spread–Spectrum Impulse Radio for Wireless Multiple–Access Communications", IEEE Transactions on Communications, vol. 48. No. 4, Apr. 2000, pp. 679–691.

M. Luise et al., "Clock Synchronization for Wavelet–Based Multirate Transmissions", IEEE Transactions on Communications, vol. 48. No. 6, Jun. 2000, pp. 1047–1054.

U.S. Appl. No. 09/685,200, filed Oct. 10, 2000, McCorkle.

U.S. Appl. No. 10/235,845, filed Sep. 6, 2002, Ochoa et al.

U.S. Appl. No. 09/684,400, filed Oct. 10, 2000, McCorkle.

U.S. Appl. No. 09/685,198, filed Oct. 10, 2000.

U.S. Appl. No. 09/685,205, filed Oct. 10, 2000, McCorkle et al.

PCT International Search Report mailed Dec. 11, 2002 in corresponding PCT application PCT/US02/28220.

* cited by examiner

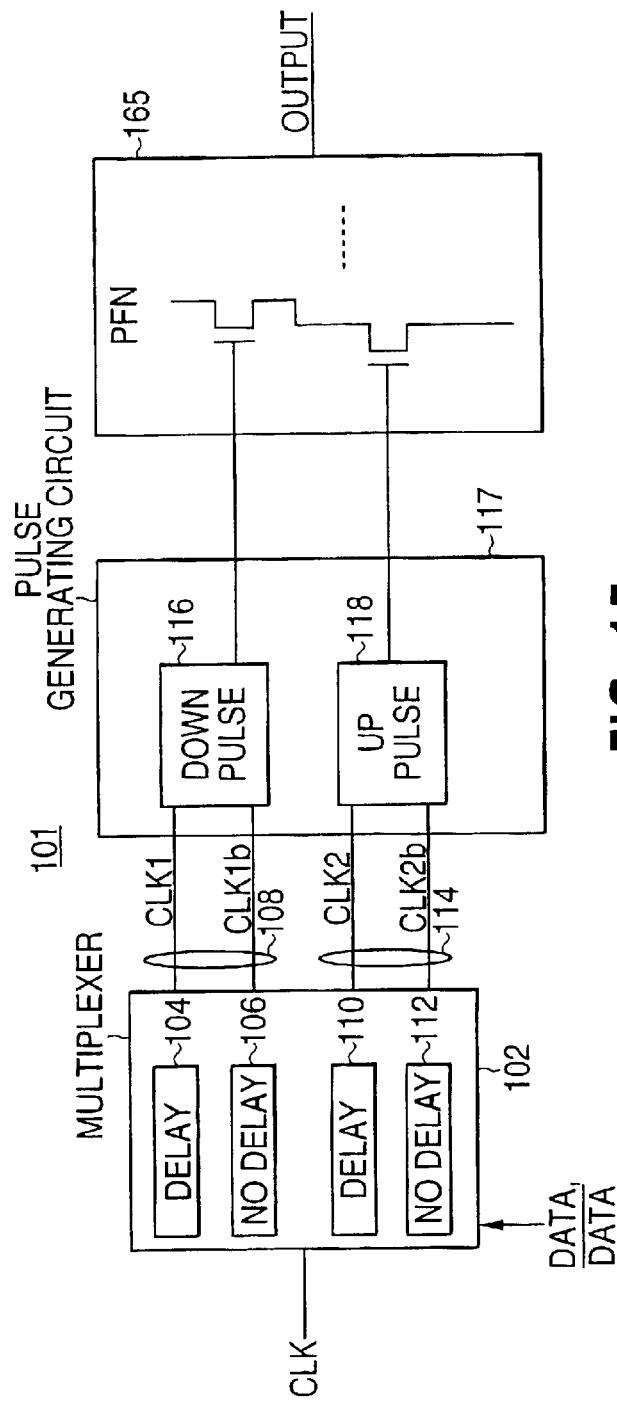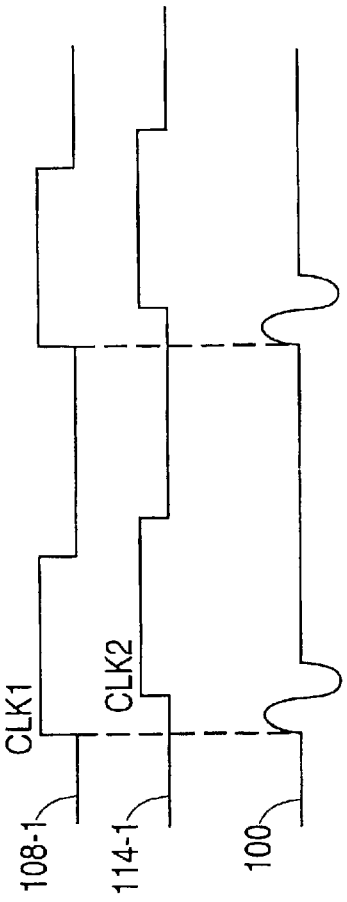

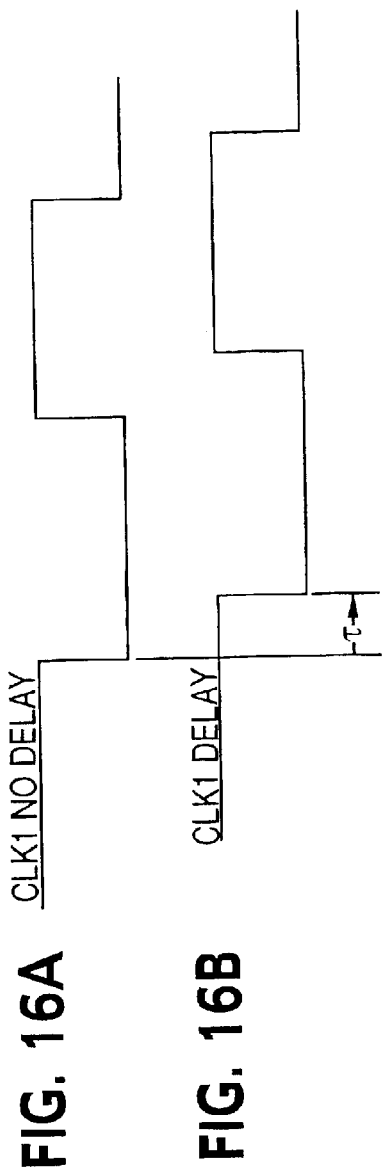
FIG. 16A
FIG. 16B
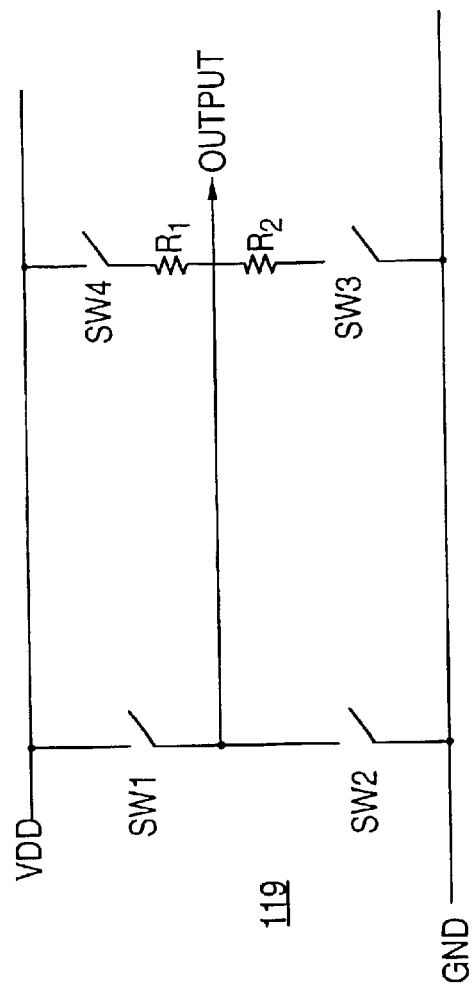
FIG. 17

FIG. 19

| STATE (POSITIVE MONOCYCLE / NEGATIVE MONOCYCLE) SWITCH | REGION | | | |
|---|---|---|---|---|
| | I | II | III | IV |
| SW1 | OPEN / OPEN | CLOSED / OPEN | OPEN / CLOSED | OPEN / OPEN |
| SW2 | OPEN / OPEN | OPEN / CLOSED | CLOSED / OPEN | OPEN / OPEN |
| SW3 | CLOSED / CLOSED | OPEN / CLOSED | CLOSED / OPEN | CLOSED / CLOSED |
| SW4 | CLOSED / CLOSED | CLOSED / OPEN | OPEN / CLOSED | CLOSED / CLOSED |

FIG. 21 TOP LEVEL SCHEMATIC TO SIMULATE NARROW-PULSE MONO CYCLE

CIRCUIT TO GENERATE A DOWN PULSE

GENERATION OF DOWN PULSE

CIRCUIT TO GENERATE A UP PULSE

Generation of UP pulse

CIRCUIT TO GENERATE BOTH UP & DOWN PULSE

PFN driver with Common Mode Regulator

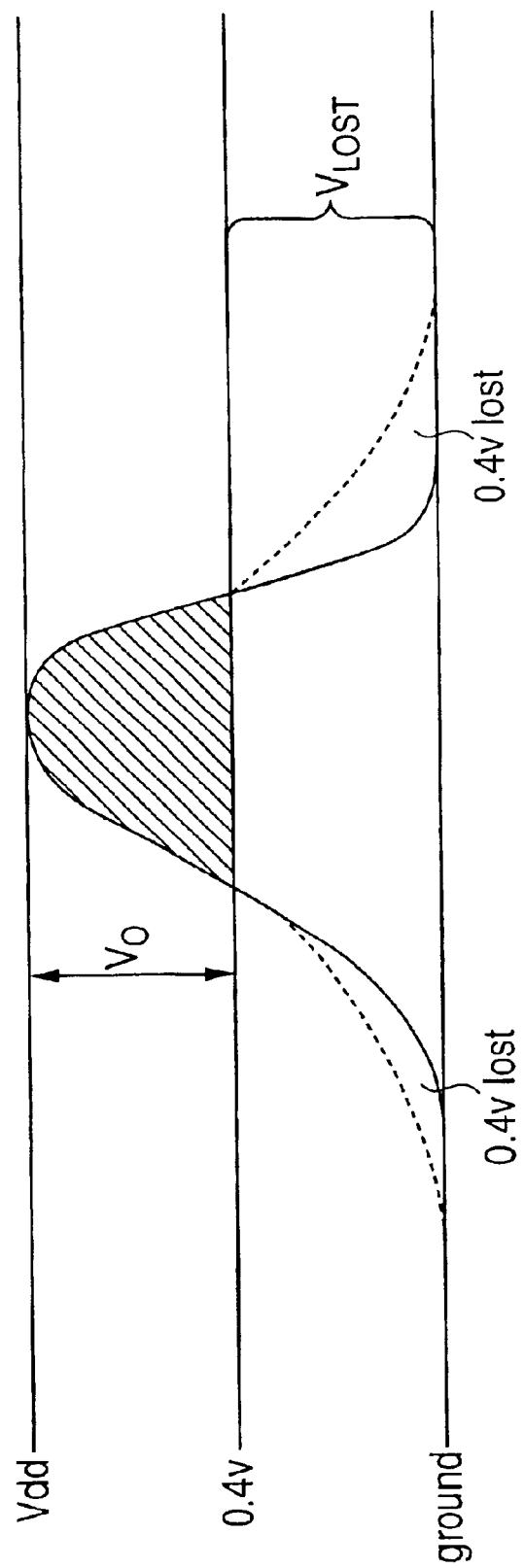

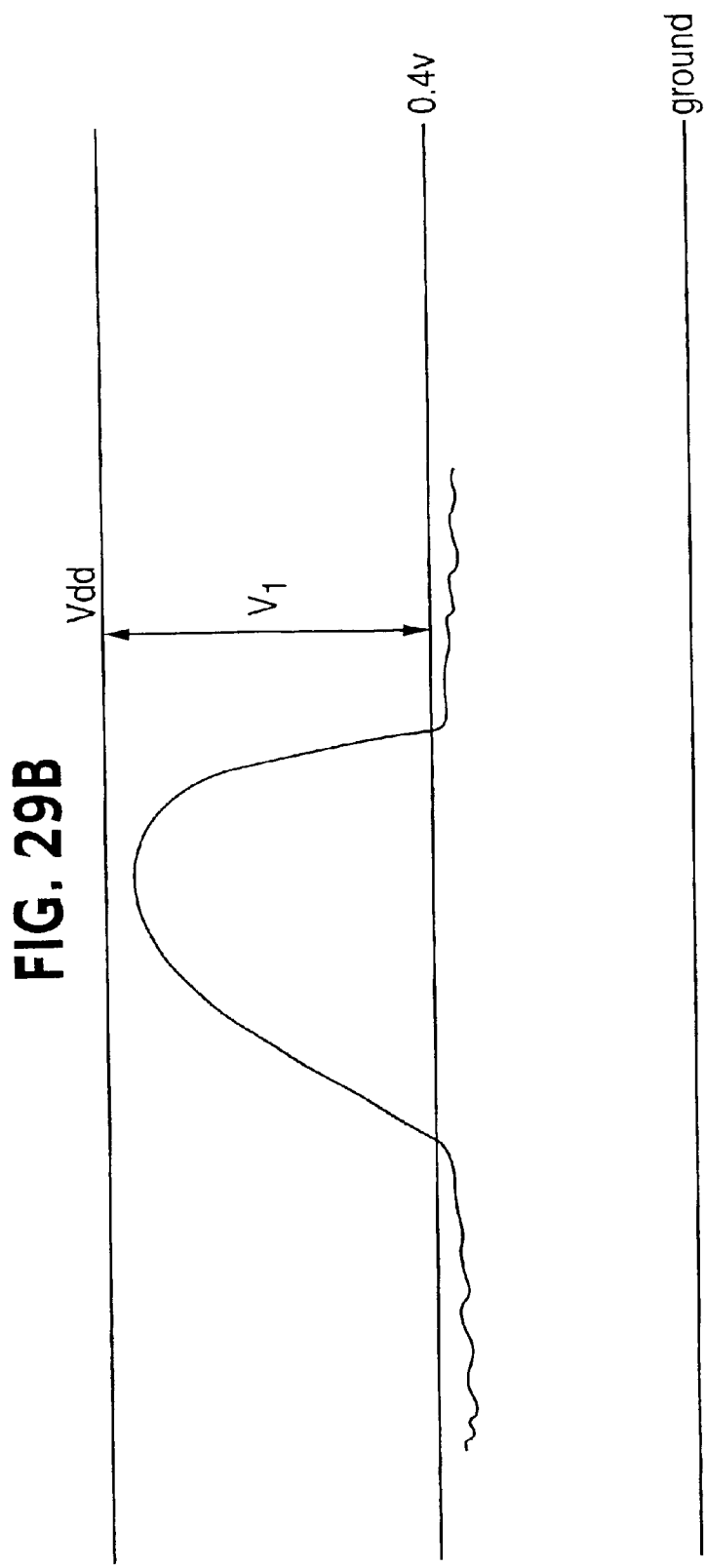

Simulation Results Showing Narrow-Pulse-Width Mono-Cycle

A: (2.60552n 450.353m)  delta: (81.6903p -854.249m)
B: (2.68722n -403.895m)  slope: -10.4572G

CIRCUIT GENERATING CONSTANT NARROW-PULSE-WIDTH BIPOLARITY CYCLE MONOCYCLES USING CMOS CIRCUITS

CROSS-REFERENCE TO RELATED APPLICATIONS

This application is related to U.S. patent application Ser. No.: 10/235,845, filed concurrently herewith, by Agustin Ochoa, Phuong Huynh, and John McCorkle, entitled A FAST MONO-CYCLE GENERATING CIRCUIT USING FULL RAIL SWING LOGIC CIRCUITS, the contents of which are incorporated herein by reference.

This application is related to U.S. Provisional Patent Application Ser. No. 60/317,496, filed Sep. 7, 2001, by Agustin Ochoa, Phuong Huynh, and John McCorkle, entitled A FAST MONO-CYCLE GENERATING CIRCUIT USING FULL RAIL SWING LOGIC CIRCUITS, to which the benefit of priority is claimed, and the contents of which is incorporated herein by reference.

This application is related to U.S. Provisional Patent Application Ser. No. 60/317,497, filed Sep. 7, 2001, by Phuong Huynh, entitled A CIRCUIT GENERATING CONSTANT NARROW-PULSE-WIDTH GAUSSIAN MONO-CYCLES USING CMOS CIRCUITS, to which the benefit of priority is claimed, and the contents of which is incorporated herein by reference.

BACKGROUND OF THE INVENTION

1. Field of the Invention

The present invention relates to ultra wide bandwidth spread-spectrum communications systems, and, more particularly, to generating constant narrow-pulse-width Gaussian-derivative-like mono-cycles using CMOS circuits.

2. Description of the Related Art

Transmission of encoded data using wavelets is known in the art. However, a problem with circuits known in the art which generate such wavelets is power consumption. That is, such circuits dissipate large amounts of power and current, including standby current.

SUMMARY OF THE INVENTION

An aspect of the present invention generates a narrow-pulse-width bipolarity cycle, or Gaussian-derivative-like mono-cycle, for ultra-wide bandwidth applications.

Another aspect of the present invention uses complementary metal-oxide-silicon (CMOS) processes to achieve a bipolarity cycle mono-cycle including a narrow pulse width.

A further aspect of the present invention uses a delay-locked-loop circuit to control a constant pulse width of a bipolarity cycle mono-cycle over process corners and temperatures.

The present invention includes a mono-cycle generating circuit including a multiplexer, a pulse generating circuit, and a buffer circuit. The multiplexer receives data of a logical 1 or a logical 0, determines whether to generate a positive mono-cycle or a negative mono-cycle, based upon the data, and outputs clock signals varying in time based upon the data. The pulse generating circuit is coupled to the multiplexer, receives the clock signals and generates a first series of pulses including an up-pulse preceding a down-pulse, or a second series of pulses including a down-pulse preceding an up-pulse, in response to the clock signals received by the multiplexer. The buffer circuit is coupled to the pulse generating circuit and includes a switch circuit and a common mode buffer. The switch circuit generates the positive mono-cycle or the negative mono-cycle, based upon whether the first series of pulses is received from the pulse generating circuit or the second series of pulses is received from the pulse generating circuit. The common mode buffer circuit is coupled to the switching circuit to set an output common mode voltage.

Moreover, the present invention includes a mono-cycle generating circuit including a first switch, a second switch, a third switch, and a fourth switch. The first switch includes a PMOS transistor coupled to a source voltage. The second switch includes an NMOS transistor coupled to the first switch and to ground. The third switch includes a PMOS transistor coupled to the source voltage. The fourth switch includes an NMOS transistor coupled to the third switch and to ground.

In addition, the present invention includes a circuit generating a narrow-width up-pulse. The circuit of the present invention includes respective series of inverters comprising complementary transistors generating delayed differential clock pulses, and a NOR gate coupled to the respective series of inverters. The NOR gate includes complementary sets of transistors controlled by the differential clock pulses to generate the up-pulse.

Moreover, the present invention includes a circuit generating a narrow-width down-pulse. The circuit of the present invention includes respective series of inverters including complementary transistors generating delayed differential clock pulses, and a NAND gate coupled to the respective series of inverters. The NAND gate includes complementary sets of transistors controlled by the differential clock pulses to generate the down-pulse.

Further, the present invention includes a circuit generating an up-pulse and a down-pulse. The circuit of the present invention includes respective series of inverters comprising complementary transistors generating delayed differential clock pulses, a NAND gate coupled to the respective series of inverters, the NAND gate including complementary sets of transistors controlled by the differential clock pulses to generate the down-pulse, and a NOR gate coupled to the respective series of inverters, the NOR gate including complementary sets of transistors controlled by the differential clock pulses to generate the up-pulse.

In addition, the present invention includes a circuit including a multiplexer inputting a differential clock and data and outputting control signals based upon the data, a down-pulse generating circuit, coupled to the multiplexer, comprising a NAND gate generating a down-pulse based upon the control signals, an up-pulse generating circuit, coupled to the multiplexer, comprising a NOR gate generating an up-pulse based upon the control signals, an up-and-down pulse generating circuit, coupled to the mulitiplexer, comprising a NAND gate and a NOR gate, and generating an up-pulse and a down-pulse based upon the control signals, and a driver circuit, coupled to the down-pulse generating circuit, to the up-pulse generating circuit, and to the up-and-down pulse generating circuit, generating mono-cycles based upon the up-pulse and the down-pulse.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 12 shows an overview block diagram of a circuit generating constant narrow-pulse-width bipolarity cycle monocycles using circuits (or constant pulse-width mono-cycle generating circuit 101) of the present invention.

FIG. 13 is a timing diagram showing a positive mono-cycle 100 produced by the constant pulse-width mono-cycle generating circuit 101 of the present invention shown in FIG. 12.

FIG. 16(A) shows a waveform diagram of CLK1 with no delay and FIG. 16(B) shows a waveform diagram of CLK1d with delay τ.

FIG. 17 shows a switch circuit of the present invention which includes complementary sets of switches, each complementary set of switches including complementary amplitude pull-up/pull-down functions such that the output mono-cycle is a full rail swing mono-cycle.

FIG. 19 is a table showing the respective states of switches SW1, SW2, SW3, and SW4 in regions I, II, III, and IV of the positive mono-cycle 100 and the negative mono-cycle 102.

FIG. 29A shows an up-pulse without AC coupling.

FIG. 29B shows an up-pulse with AC coupling.

DETAILED DESCRIPTION OF THE PREFERRED EMBODIMENTS

Figure 1A:
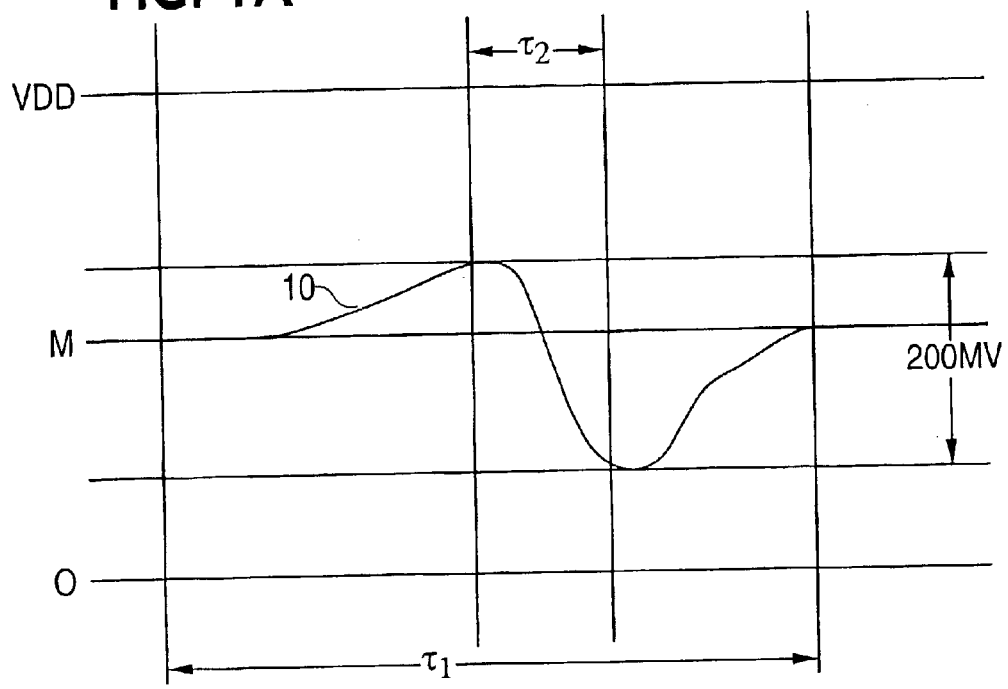
FIGS. 1A and 1B show examples of mono-cycles.
Figure 1B:
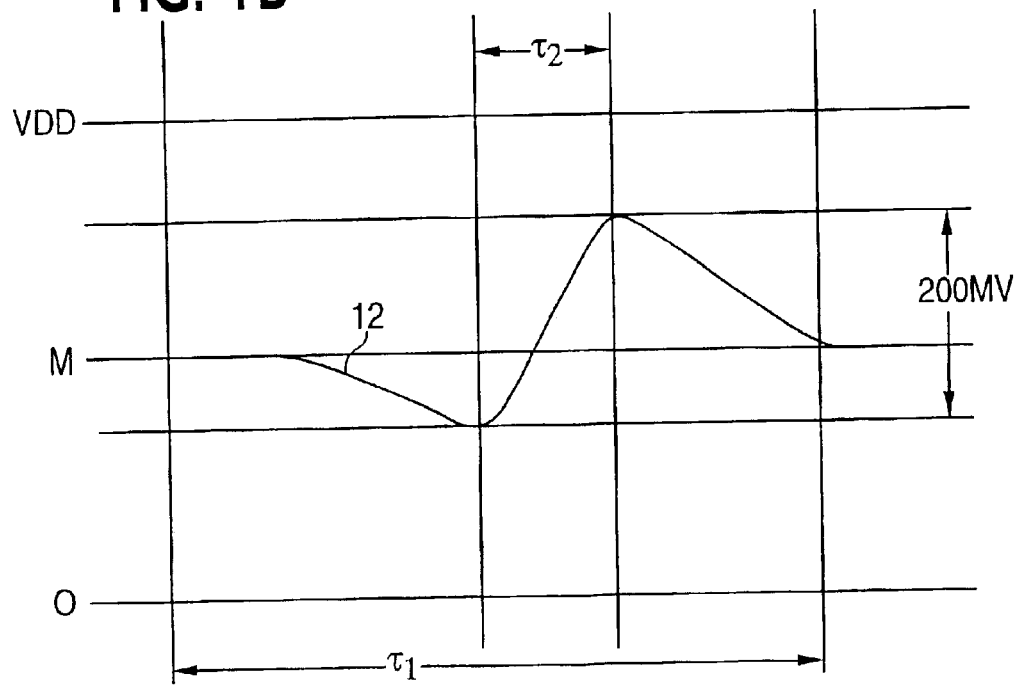

Before a detailed description of the present invention is presented, a brief description of mono-cycles is presented. FIGS. 1A and 1B show examples of mono-cycles. Whether a mono-cycle is a positive mono-cycle or a negative mono-cycle is arbitrarily selected. Sequences of the mono-cycles 10, 12 shown in FIGS. 1A and 1B, either individually or in series, encoded as logical "1" or logical "0" transmit information from an ultra-wide bandwidth transmitter to an ultra-wide bandwidth receiver.

Embodiments of the present invention are discussed after a brief discussion of the generation of bipolarity cycle mono-cycles using logic circuits. Examples of logic circuits would be CMOS logic circuits. Examples of line-widths would be 0.18 micrometers, and examples of pulse widths would be 80 picoseconds.

Throughout the following description, the following terminology is used. CLKin and CLKinb refer to clock-in and clock-in bar. Clock-in bar is 180 degrees out of phase with CLKin, and thus CLKin and CLKinb are differential clocks. In addition, CLKd refers to CLKin delayed in time from CLKin, as determined by the delay circuits through which CLKin passes en route to forming CLKd. Further, CLKdb refers to CLKinb delayed in time from CLKinb, as determined by the delay circuits through which CLKb passes en route to forming CLKdb. That is, CLKd and CLKdb are 180 degrees out of phase with each other, and form differential clocks. Moreover, a source voltage is referred to as Vdd.

Figure 2A:
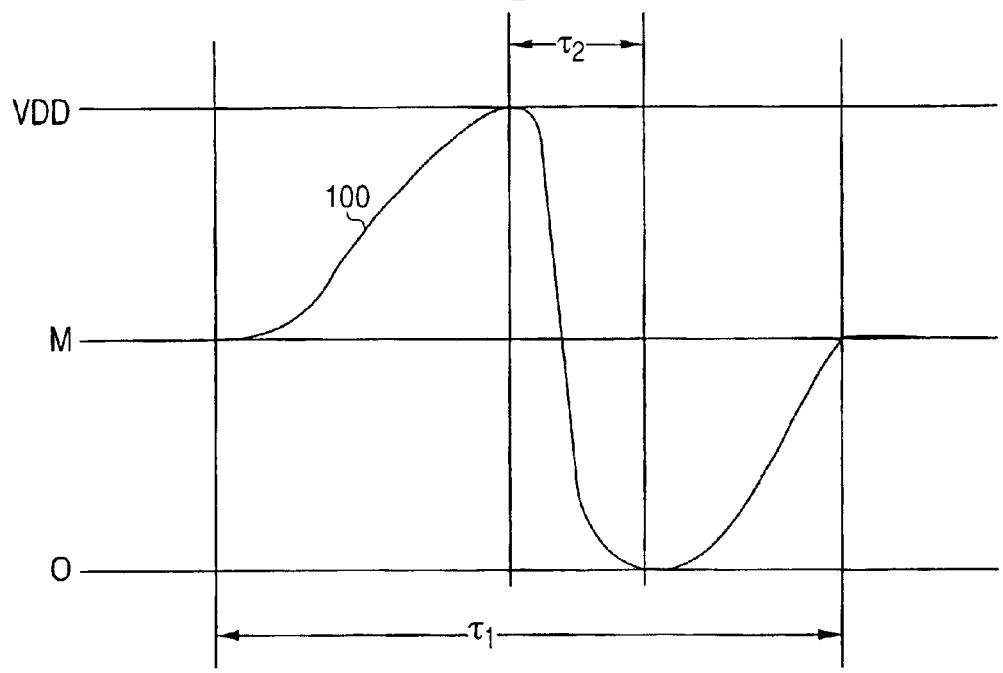
FIG. 2A shows a positive bipolarity cycle mono-cycle having period τ1 and peak-to-peak pulse width τ2.
Figure 2B:
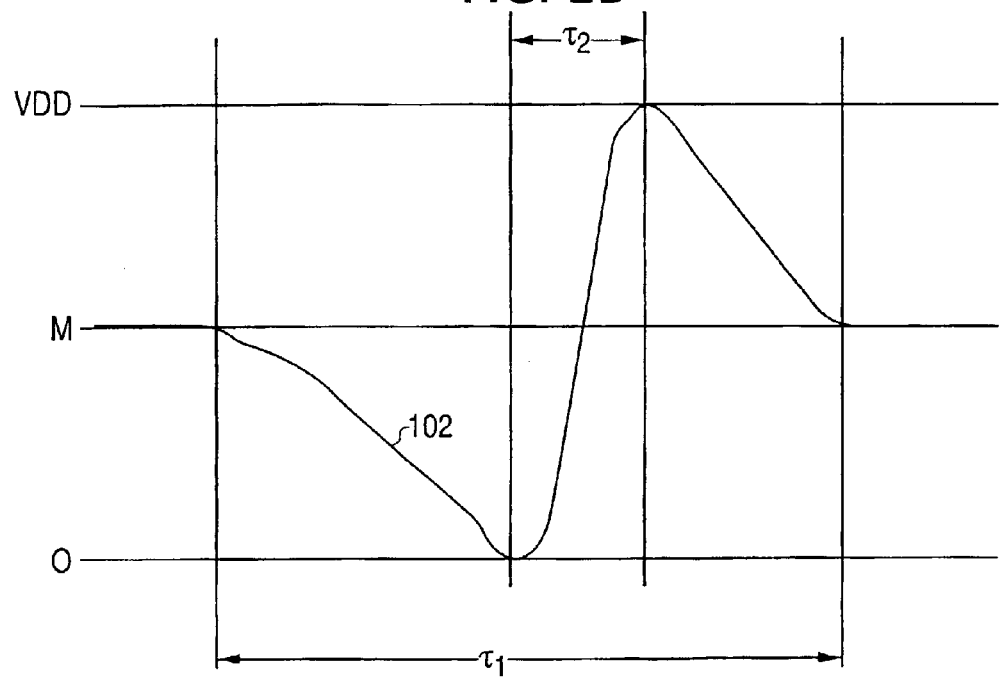
FIG. 2B shows a negative bipolarity cycle mono-cycle having a period τ1 and a peak-to-peak pulse width τ2.

FIG. 2A shows a positive bipolarity cycle mono-cycle having period τ1 and a pulse width τ2, and FIG. 2B shows a negative bipolarity cycle mono-cycle having a period τ1 and a pulse width τ2. Using standard NAND gate, AND gate, OR gate, and NOR gate logic circuits implemented in 0.18 micrometer CMOS technology, a bipolarity cycle mono-cycle having a pulse width (τ2) of approximately 220 picoseconds can be generated. However, the circuitry generating the 220 picosecond pulse width (τ2) is not fast enough to be practical in ultra-wide-band communications systems.

A circuit generating either a positive mono-cycle or a negative mono-cycle require both an up-pulse and a down-pulse as an input. Complementary metal-oxide-silicon (CMOS) logic circuits can be used to generate positive mono-cycles and negative mono-cycles.

Figure 3:
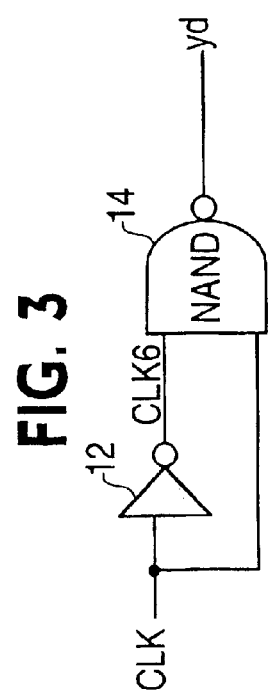
FIG. 3 shows a logic circuit 10 receiving as an input a clock signal CLK and generating a down-pulse as an output yd.
Figure 4:
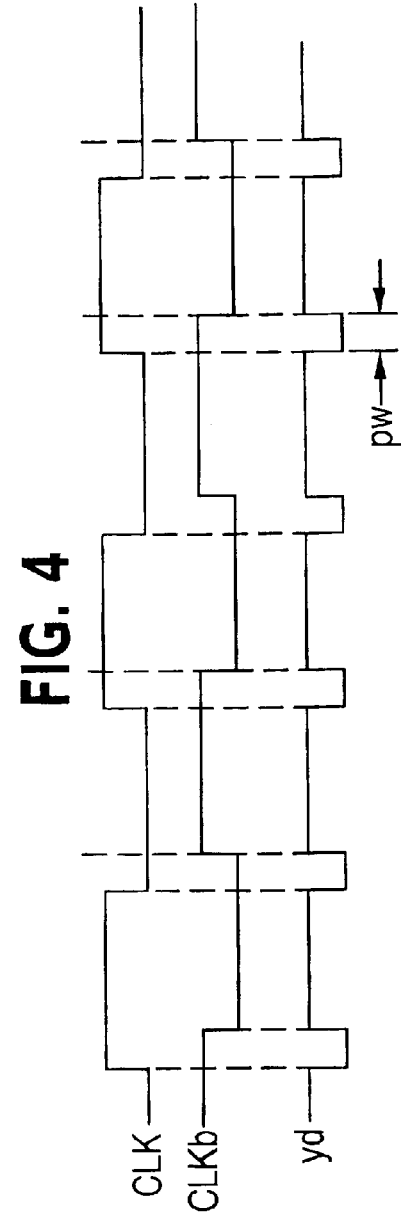
FIG. 4 shows a timing diagram corresponding to the logic circuit 10 shown in FIG. 3.

FIG. 3 shows a CMOS logic circuit 10 receiving as an input a clock signal CLK and generating a down-pulse as an output yd. FIG. 4 shows a timing diagram corresponding to the logic circuit 10 shown in FIG. 3. Referring now to FIGS. 3 and 4, clock pulse CLK is input to an inverter 12, which outputs an inverted clock pulse CLKb. Both CLK and CLKb are then input to NAND gate 14, which outputs the down-pulse yd. The pulse width pw of each down-pulse yd is to be minimized.

Figure 5:
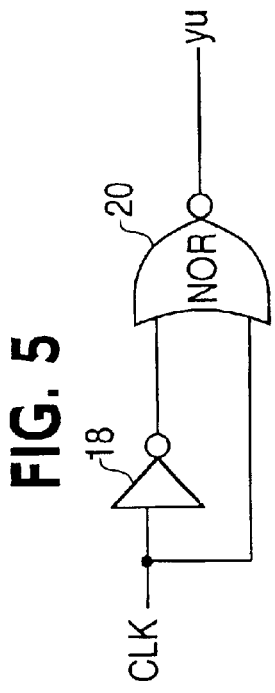
FIG. 5 shows a logic circuit 16 receiving as an input a clock signal CLK and generating an up-pulse as an output yu.
Figure 6:
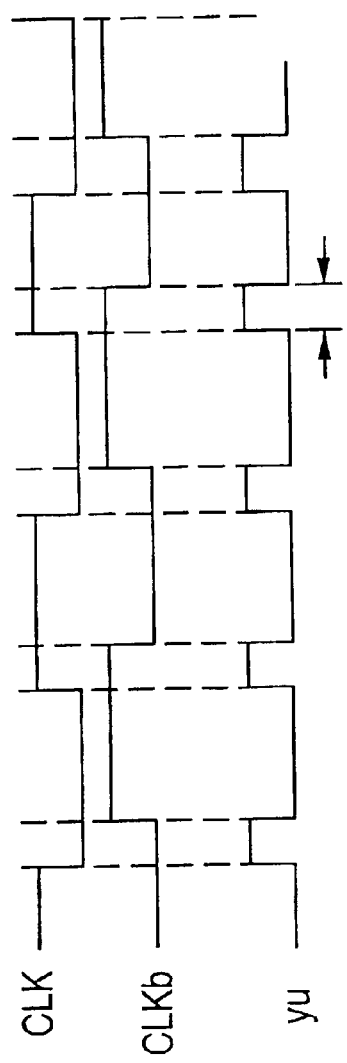
FIG. 6 shows a timing diagram corresponding to the logic circuit 16 shown in FIG. 5.

FIG. 5 shows a CMOS logic circuit 16 receiving as an input a clock signal CLK and generating an up-pulse as an output yu. FIG. 6 shows a timing diagram corresponding to the logic circuit 16 shown in FIG. 5. Referring now to FIGS. 5 and 6, clock pulse CLK is input to an inverter 18, which outputs an inverted clock pulse CLKb. Both CLK and CLKb are then input to NOR gate 20, which outputs the up-pulse yu. The pulse width pw of each up-pulse yu is to be minimized.

Figure 7:
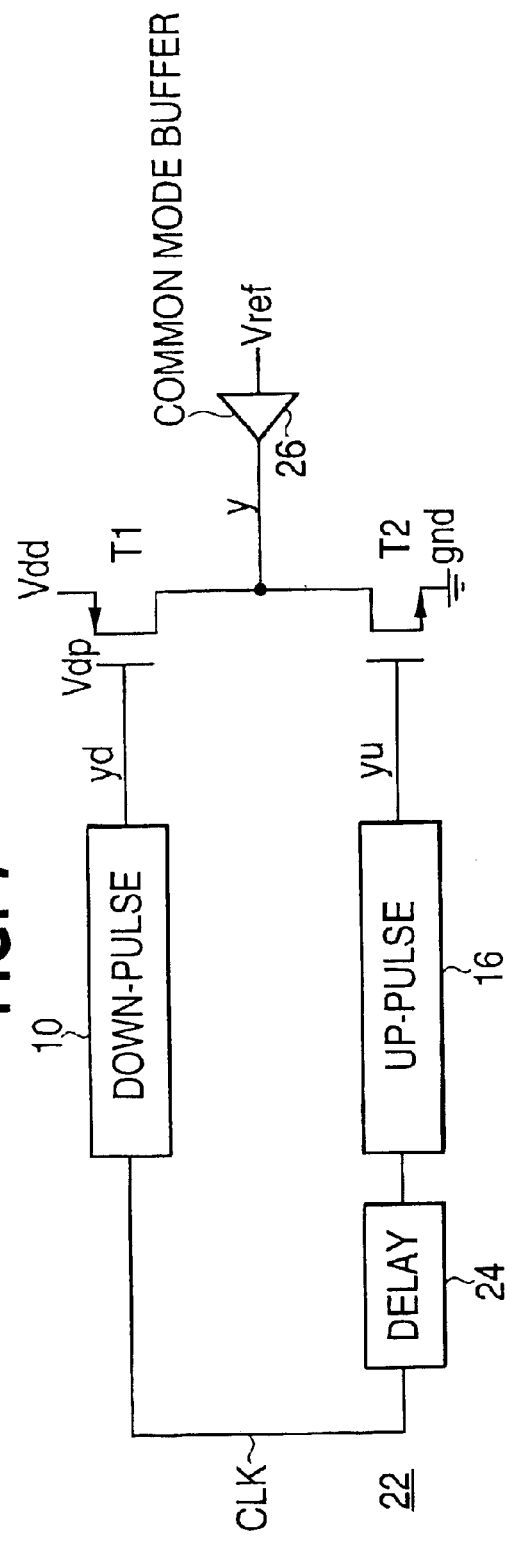
FIG. 7 shows a circuit 22 generating a positive bipolarity cycle mono-cycle.

FIG. 7 shows a circuit 22 generating a positive bipolarity cycle mono-cycle. A clock pulse CLK is input to the down-pulse circuit 10 shown in FIG. 3 and to a delay circuit 24, which delays input of the clock pulse CLK to up-pulse circuit 16 shown in FIG. 5. Down-pulse circuit 10 then outputs yd, and up-pulse circuit 16 then outputs yu. Output yd then controls the gate of pMOS transistor, and yu controls the gate of nMOS transistor T2. The drains of each of transistors T1 and T2 are coupled to common mode buffer 26, the input to which is the reference voltage Vref. The source of transistor T1 is coupled to Vdd, and the source of transistor T2 is coupled to ground. Common mode voltage, y, is output by common mode buffer. The common mode voltage is the dc voltage level which the pulse sits on.

Figure 8:
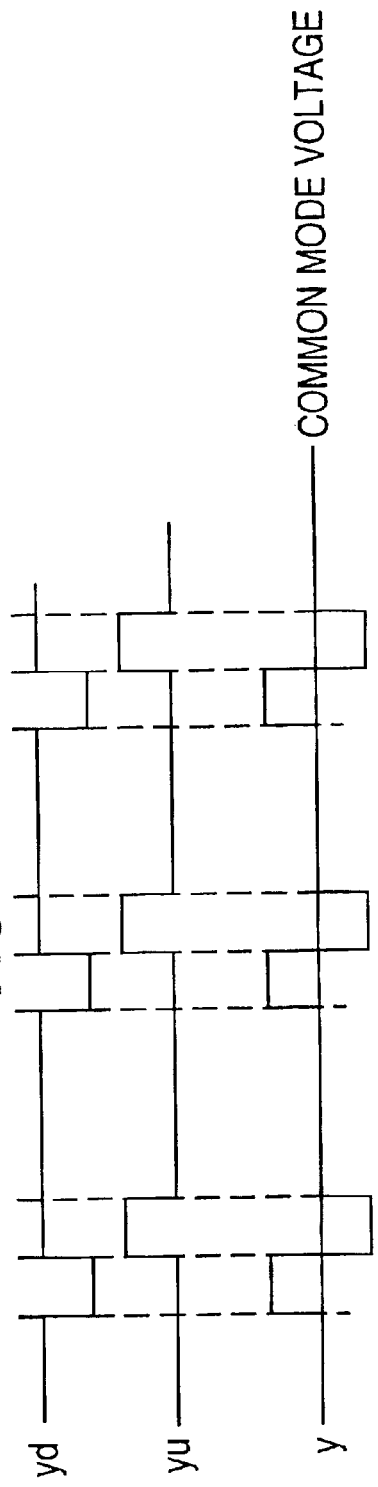
FIG. 8 shows timing diagrams corresponding to yd, yu, and y.

The common mode voltage y is the same as the positive bipolarity cycle mono-cycle. Timing mode diagrams corresponding to yd, yu, and y are shown in FIG. 8. As shown in FIG. 8, a positive bipolarity cycle mono-cycle, corresponding to the common mode voltage y, is generated when down-pulse yd precedes in time up-pulse yu.

Figure 9:
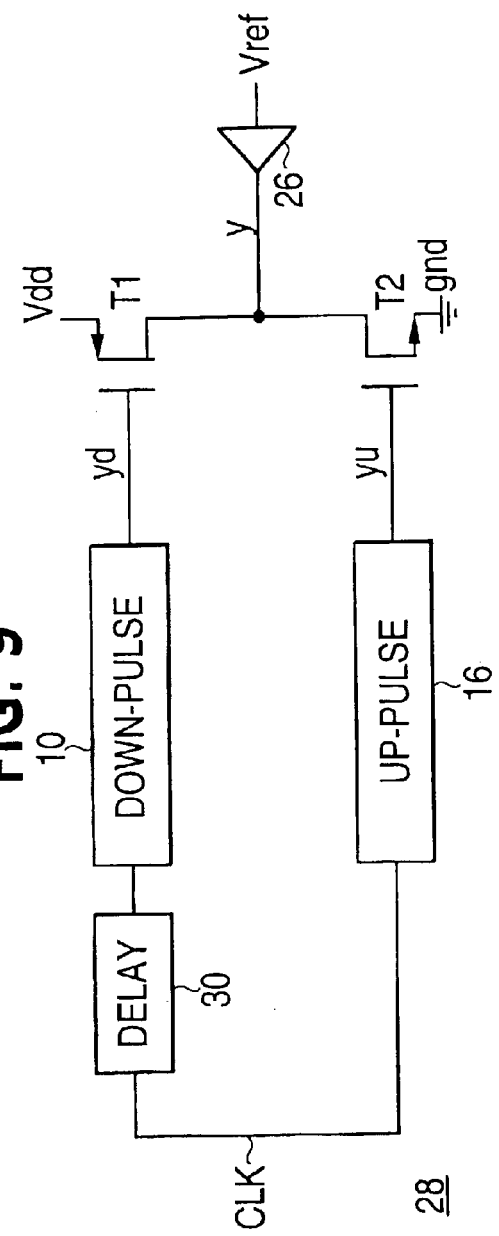
FIG. 9 shows a circuit 28 generating a negative bipolarity cycle mono-cycle.

FIG. 9 shows a circuit 28 generating a negative bipolarity cycle mono-cycle. A clock pulse CLK is input to the up-pulse circuit 16 shown in FIG. 5 and to a delay circuit 30, which delays input of the clock pulse CLK to down-pulse circuit 10 shown in FIG. 3. Down-pulse circuit 10 then outputs yd, and up-pulse circuit 16 then outputs yu. Output yd then controls the gate of pMOS transistor T1, and yu controls the gate of nMOS transistor T2. The drains of each of transistors T1 and T2 are coupled to common mode buffer 26, the input to which is the reference voltage Vref. The source of transistor T1 is coupled to Vdd, and the source of transistor T2 is coupled to ground. Common mode voltage, y, is output by common mode buffer amplifier 26.

Figure 10:
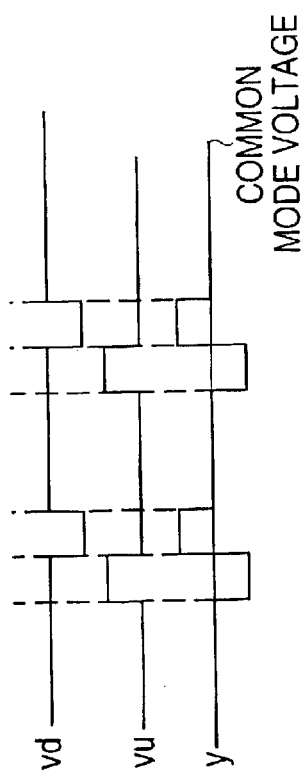
FIG. 10 shows timing diagrams corresponding to yd, yu, and y.

Timing diagrams corresponding to yd, yu, and y are shown in FIG. 10. As shown in FIG. 10, a negative bipolarity cycle mono-cycle, corresponding to the common mode voltage y, is generated when down-pulse yd succeeds in time up-pulse yu. The common mode voltage y is the same as the negative bipolarity cycle mono-cycle.

Figure 11:
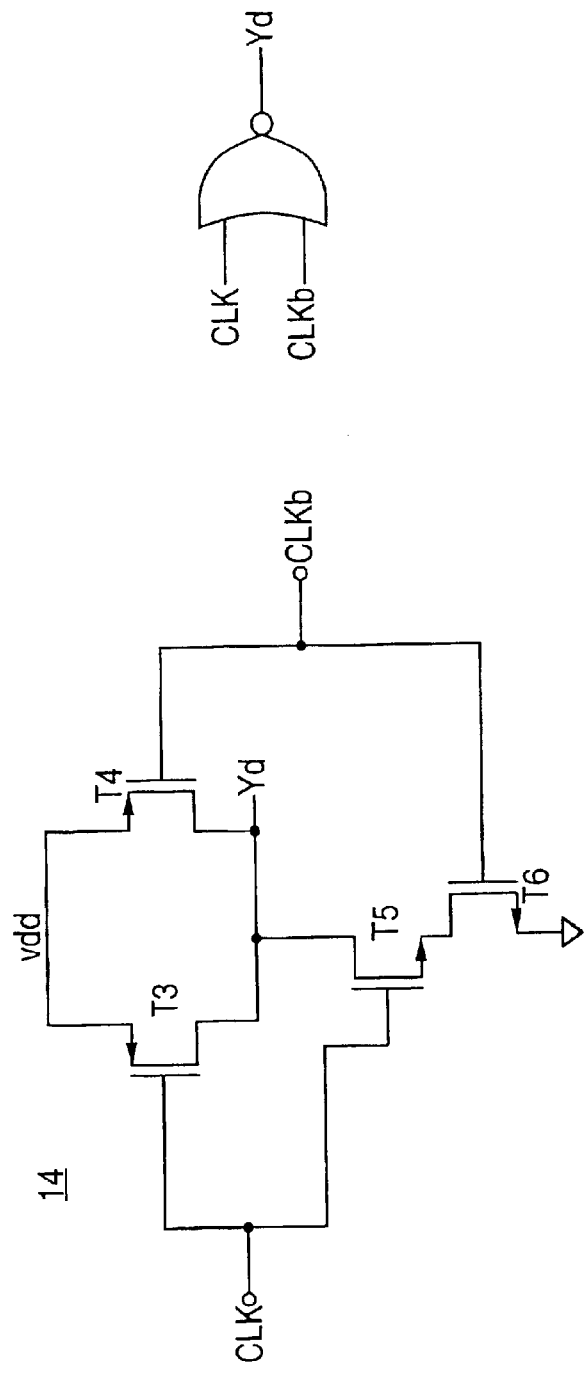
FIG. 11 shows a diagram of CMOS NAND gate 14.

FIG. 11 shows a diagram of NAND gate 14. As shown in FIG. 11, NAND gate 14 comprises two pMOS transistors T3, T4 coupled in parallel with each other between Vdd and yd, and two nMOS transistors T5 and T6 coupled in series with each other between yd and ground. Coupling two nMOS transistors T5 and T6 in series increases the total resistance to ground over what can be achieved with a single transistor. This limits $\tau 2$, the width of the positive monocycle, to approximately 220 picoseconds if implemented in 0.18 micrometer CMOS.

Moreover, two pMOS transistors would be implemented in series between Vdd and yu, and two nMOS transistors would be implemented in parallel between yu and ground. Therefore, a 220 picosecond pulse width $\tau 2$ negative mono-cycle can be achieved using a NOR gate implemented using standard 0.18 micrometer line width CMOS technology due to the larger resistance from the series pMOS transistors, and, thus, an increased resistance.

A problem, though, is that neither the above-mentioned NAND gate 14 nor the above-mentioned NOR gate 20 is fast enough to reduce the pulse width $\tau 2$ of either a positive mono-cycle or a negative mono-cycle, respectively.

Therefore, what is needed is a new circuit to generate a narrow down-pulse and a new circuit to generate a narrow up-pulse. The present invention, now described, generates a narrow down-pulse and a narrow up-pulse.

FIG. 12 shows an overview block diagram of a circuit generating constant narrow-pulse-width bipolarity cycle monocycles using CMOS circuits (or constant pulse-width mono-cycle generating circuit 101) of the present invention. More particularly, the constant pulse-width mono-cycle generating circuit 100 of the present invention receives a clock input (CLK) input into delay multiplexer 102. Delay multiplexer 102 also receives as an input DATA, which comprises either logical "1" or logical "0". The logical value of DATA, that is, either logical "1" or logical "0", determines whether the constant pulse-width mono-cycle generating circuit 101 outputs a positive mono-cycle or a negative mono-cycle, respectively. More particularly, the logical value of DATA determines whether delay 104 or no delay 106 is introduced by the delay multiplexer 102 into CLK1/CLK1b lines 108 and whether delay 110 or no delay 112 is introduced into CLK2/CLK2b lines 114. The delay multiplexer 102 of the present invention produces from input CLK outputs 2 sets of differential clocks, CLK1 and CLK1b (which is 180 degrees out of phase of CLK1), and CLK2 and CLK2b (which is 180 degrees out of phase of CLK2). Clocks CLK1, CLK1b, CLK2, and CKL2b are input into pulse circuit 119. More particularly, CLK1 and CLK1b are input into down-pulse circuit 116, while CLK2 and CLK2b are input into up-pulse circuit 118.

Down-pulse circuit 116 and up-pulse circuit 118 are coupled to PFN_Driver circuit 165, which comprises switch circuit 119 and buffer circuit 120 and which outputs the positive mono-cycle and the negative mono-cycle as OUTPUT.

FIG. 13 is a timing diagram showing a positive mono-cycle 100 produced by the constant pulse-width mono-cycle generating circuit 101 of the present invention shown in FIG. 12. As shown in FIG. 13, if a change in the logical value CLK1 108-1 from low to high precedes the same change in the logical value of CLK2 114-1, then positive mono-cycle 100 is produced by the constant pulse-width mono-cycle generating circuit 101 of the present invention. That is, a rising edge of CLK1 followed by a rising edge of CLK2 causes the mono-cycle to rise from the mid-rail to VDD, then to fall to GND, then return to mid-rail, which waveform is defined as a positive mono-cycle 100.

Figure 14:
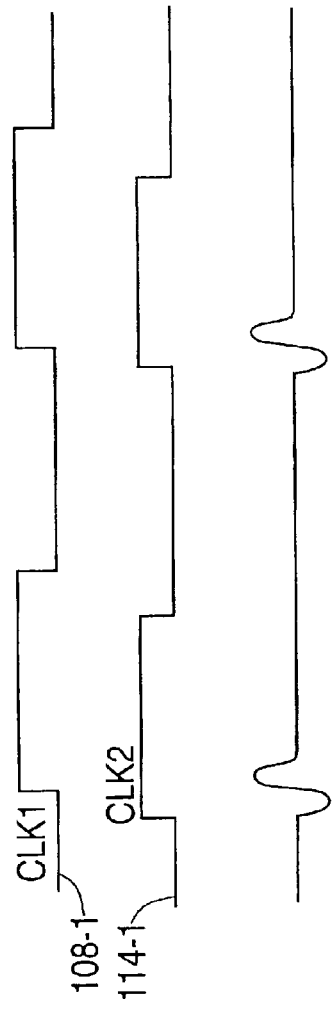
FIG. 14 is a timing diagram showing a negative mono-cycle 102 also produced by the constant pulse-width mono-cycle generating circuit 101 of the present invention shown in FIG. 12.

In contrast, FIG. 14 is a timing diagram showing a negative mono-cycle 102 also produced by the constant pulse-width mono-cycle generating circuit 101 of the present invention shown in FIG. 12. As shown in FIG. 14, if a change in the logical value CLK2 114-1 from low voltage to high voltage, that is, a rising edge precedes the same change in the logical value of CLK1 108-1, then negative mono-cycle 102 is produced by the constant pulse-width mono-cycle generating circuit 101 of the present invention. That is, a rising edge of CLK2 followed by a rising edge of CLK1 causes the mono-cycle to fall from the mid-rail to GND, then to rise to VDD, then return to mid-rail, which is defined as a negative mono-cycle 102.

Figure 15:
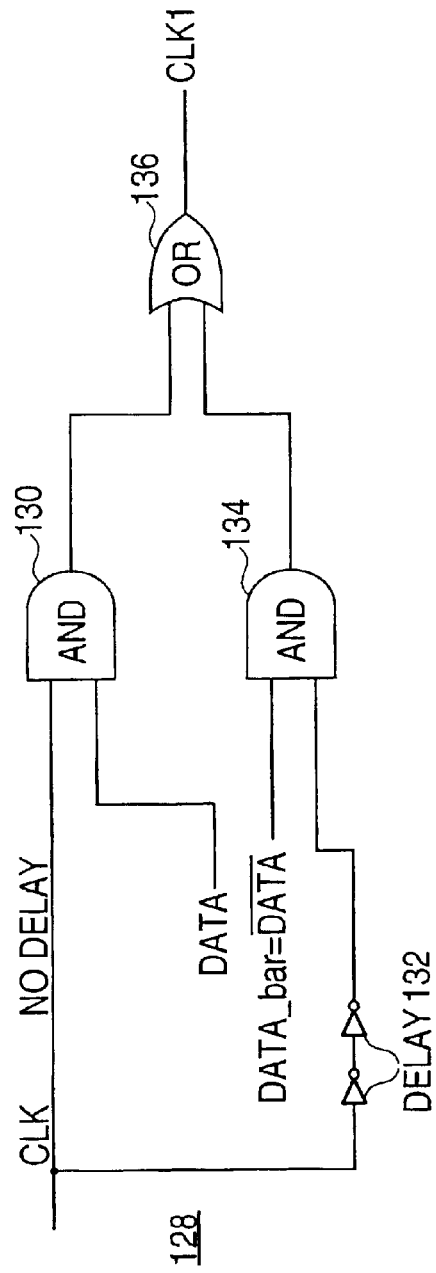
FIG. 15 shows an example of a circuit 128 generating CLK1 from an input CLK.

FIG. 15 shows an example of a circuit 128 generating CLK1 from an input CLK. As shown in FIG. 15, CLK is input to circuit 128, and is then input with no delay to AND gate 130. In parallel, CLK is input to delay circuit 132, then to AND gate 134 with delay. In addition, DATA is input to AND gate 130 while DATA_bar is input to AND gate 134. The resultant output of both AND gate 130 and AND gate 134 is input to OR gate 136. The output of OR gate 136 is CLK1.

FIG. 16(A) shows a waveform diagram of CLK1 with no delay, while FIG. 16(B) shows a waveform diagram of CLK1d with delay τ.

FIGS. 17–20 are explanatory diagrams of the switch circuit 119 of the present invention.

The switch circuit 119 shown in FIG. 17 includes complementary sets of switches, each complementary set of switches including complementary amplitude pull-up/pull-down functions such that the output mono-cycle is a full rail swing mono-cycle. Based upon which switches SW1, SW2, SW3, or SW4 are open or closed and in what sequence, either positive mono-cycle 100 or negative mono-cycle 102 is produced as OUTPUT by the transistor implementation of switch circuit 119. As is explained in further detail herein below, the state of switches SW1 and SW4 determines the shape of the upper rail of mono-cycles 100, 102, while the state of switches SW2 and SW3 determines the shape of the lower rail of mono-cycles 100, 102. A return of the mono-cycles 100, 102 to mid-rail (M) can be based upon the voltage divider including resistors R1 and R2 connected in parallel with OUTPUT. Alternatively, as shown in FIG. 17, the first pair of switches (SW1 and SW2) are designed and controlled to drive full rails while the second pair of switches (SW3 and SW4) drive to a common mode value that is between the power and ground rails. In this case the resistors R1 and R2 replaced by transistors SFN and SFP which are controlled by a common mode amplifier to control the common mode voltage. That is, transistors SFP and SFN are driven by a common mode amplifier explained later. This makes their drive dynamic to return the output node to a common mode value.

Figure 18A:
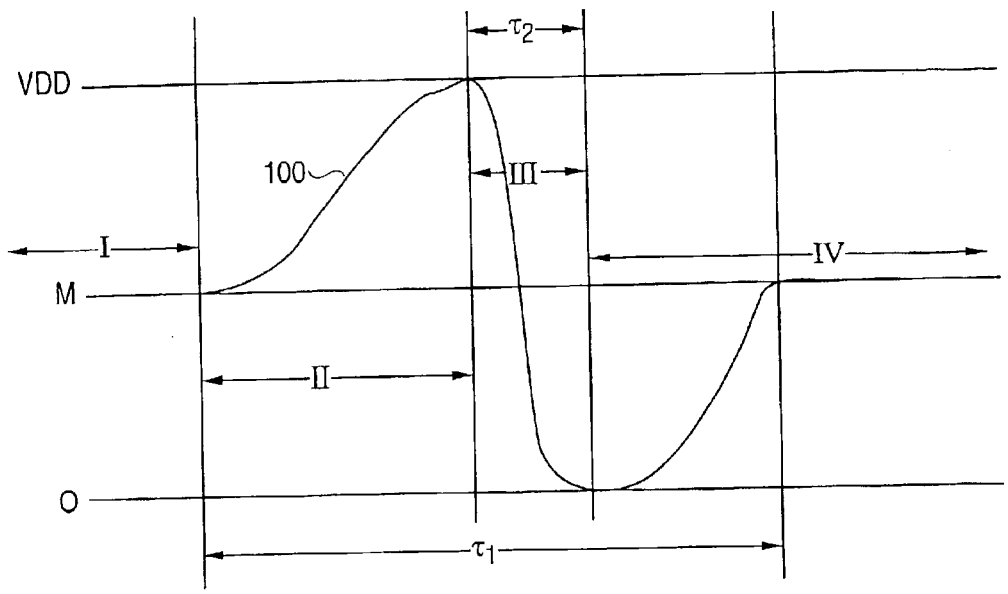
FIG. 18A shows positive mono-cycle 100.
Figure 18B:
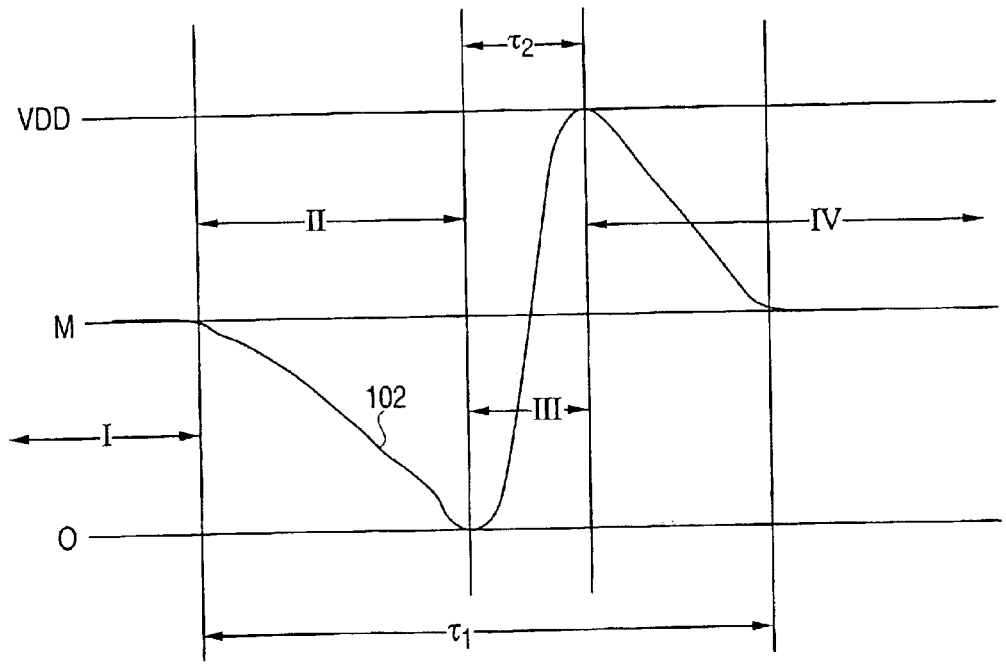
FIG. 18B shows negative mono-cycle 102.

FIGS. 18A and 18B show positive mono-cycle 100 and negative mono-cycle 102, as shown in FIGS. 2A and 2B, respectively, but with the periods for each divided into regions I, II, III, and IV as indicated. For the following explanation, reference is made to the positive mono-cycle 100 shown in FIG. 18A. However, the transistor implementation shown in FIG. 17 (including resistors R1 and R2 for this discussion) also produces negative mono-cycle 102 as shown in FIGS. 2B and 18B, as explained herein below.

Referring now to FIG. 18A, region I occurs before the start of the first pulse of the mono-cycle 100. In period I, switches SW3 and SW4 are closed, and switches SW1 and SW2 are open. The value of OUTPUT is at the mid-rail M, based upon resistive divider R1, R2.

Referring again to FIG. 18A, to move the positive mono-cycle 100 into region II, switch SW1 is closed and, simultaneously, switch SW3 is opened. That is, in region II, switch SW1 is closed, switch SW2 is open, switch SW3 is open, and switch SW4 is closed. In region II, the value of positive mono-cycle 100 proceeds from mid-rail (M) to VDD.

To move the mono-cycle 100 to region II, switches SW1 and SW4 are opened simultaneously, and switches SW2 and SW3 are closed simultaneously. In region III, the value of positive mono-cycle 100 moves from VDD to GND (ground, or 0 volts).

Next, to move the mono-cycle 100 proceeds to region IV, switch SW2 is opened and switch SW4 is closed. That is, switches SW1 and SW2 are open and switches SW3 and SW4 are closed, thus enabling the resistive divider R1, R2 to pull the value of positive mono-cycle 100 to mid-rail (M).

To produce the negative mono-cycle 102 shown in FIG. 18B, the state of switches SW1, SW2, SW3, and SW4 is the same as that of the positive mono-cycle 100 shown in FIG. 18A in regions I and IV. However, to produce the negative mono-cycle 102, switch SW2 is closed simultaneously with switch SW4 being opened in region II. That is, in region II of the negative mono-cycle 102, switch SW1 is open, switch SW2 is closed, switch SW3 is closed, and switch SW4 is open. In region III of the negative mono-cycle 102, switches SW1 and SW4 are closed, while switches SW2 and SW3 are open.

FIG. 19 is a table showing the respective states of switches SW1, SW2, SW3, and SW4 in regions I, II, III, and IV of the positive mono-cycle 100 and the negative mono-cycle 102, as described herein above. For example, in region II, switch SW2 is open to produce the positive mono-cycle 100, while switch SW2 is closed to produce the negative mono-cycle 102.

The above-mentioned transistor implementation shown in FIG. 17 can be implemented using either complementary bipolar transistors or CMOS.

Figure 20:
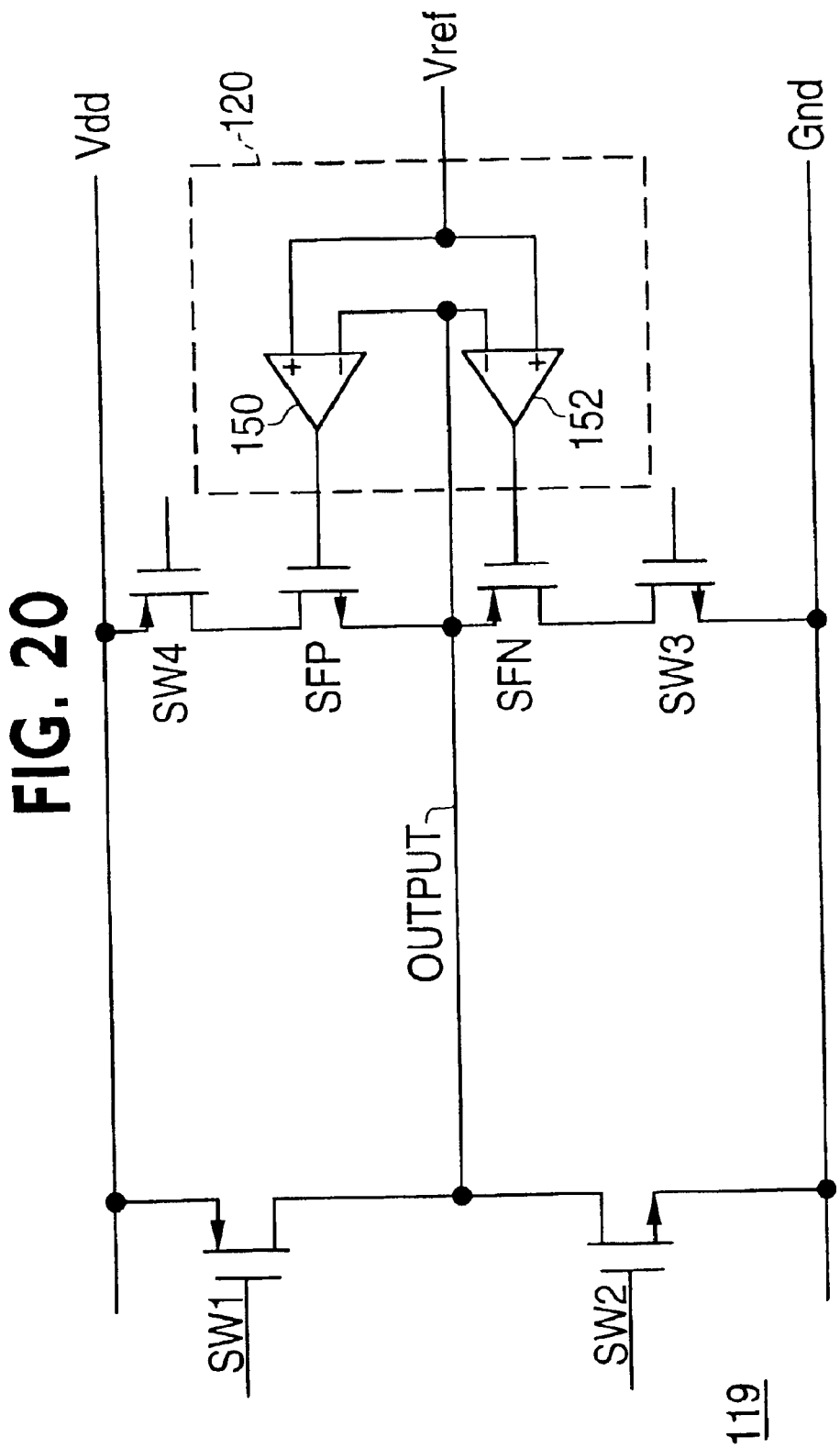
FIG. 20 shows an embodiment of a switch circuit 119 and common mode buffer 120 of the present invention, implemented in CMOS.

FIG. 20 shows an embodiment of a switch circuit 119 and common mode buffer 120 of the present invention, implemented in CMOS. The switch circuit 119 of FIG. 20 corresponds to the transistor implementation shown in FIG. 17 with the resistors removed.

Figure 28A:
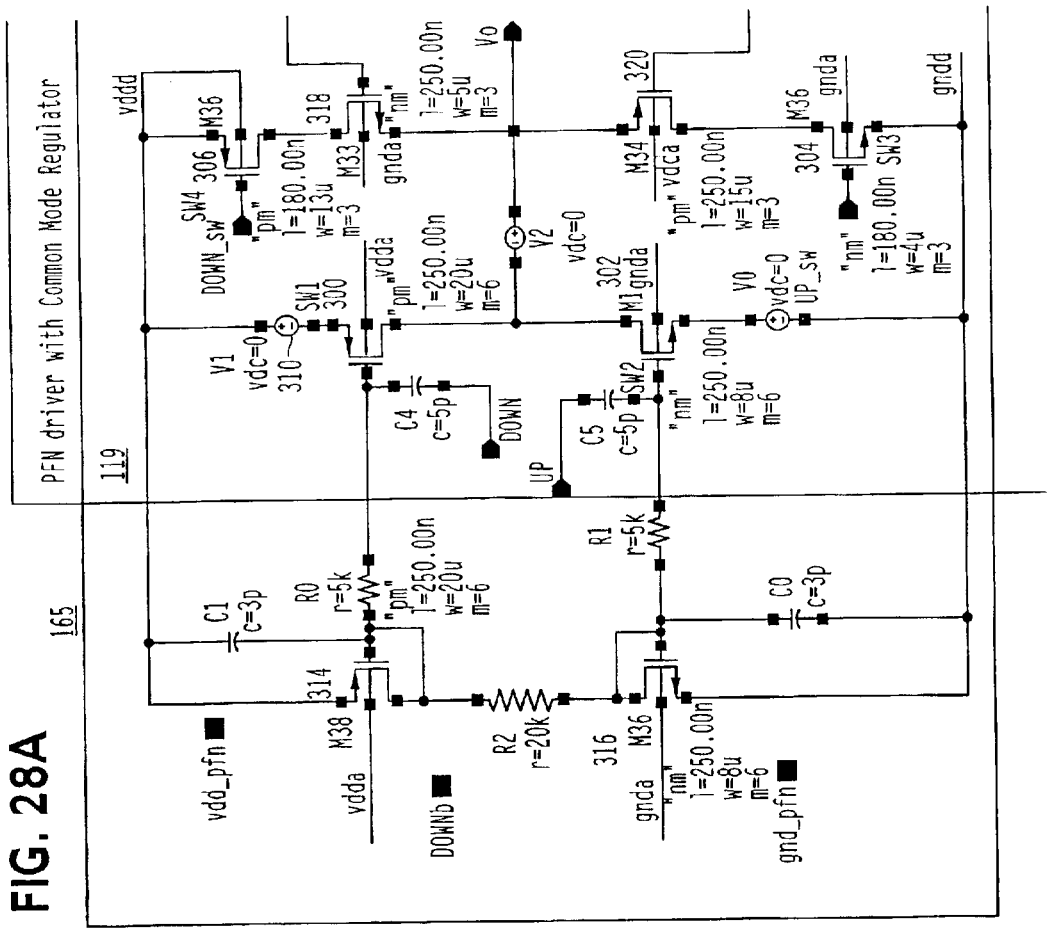
FIG. 28 shows a PFN driver with common mode regulator circuit (or PFN-Driver circuit) 165 shown in FIG. 21.
Figure 28B:
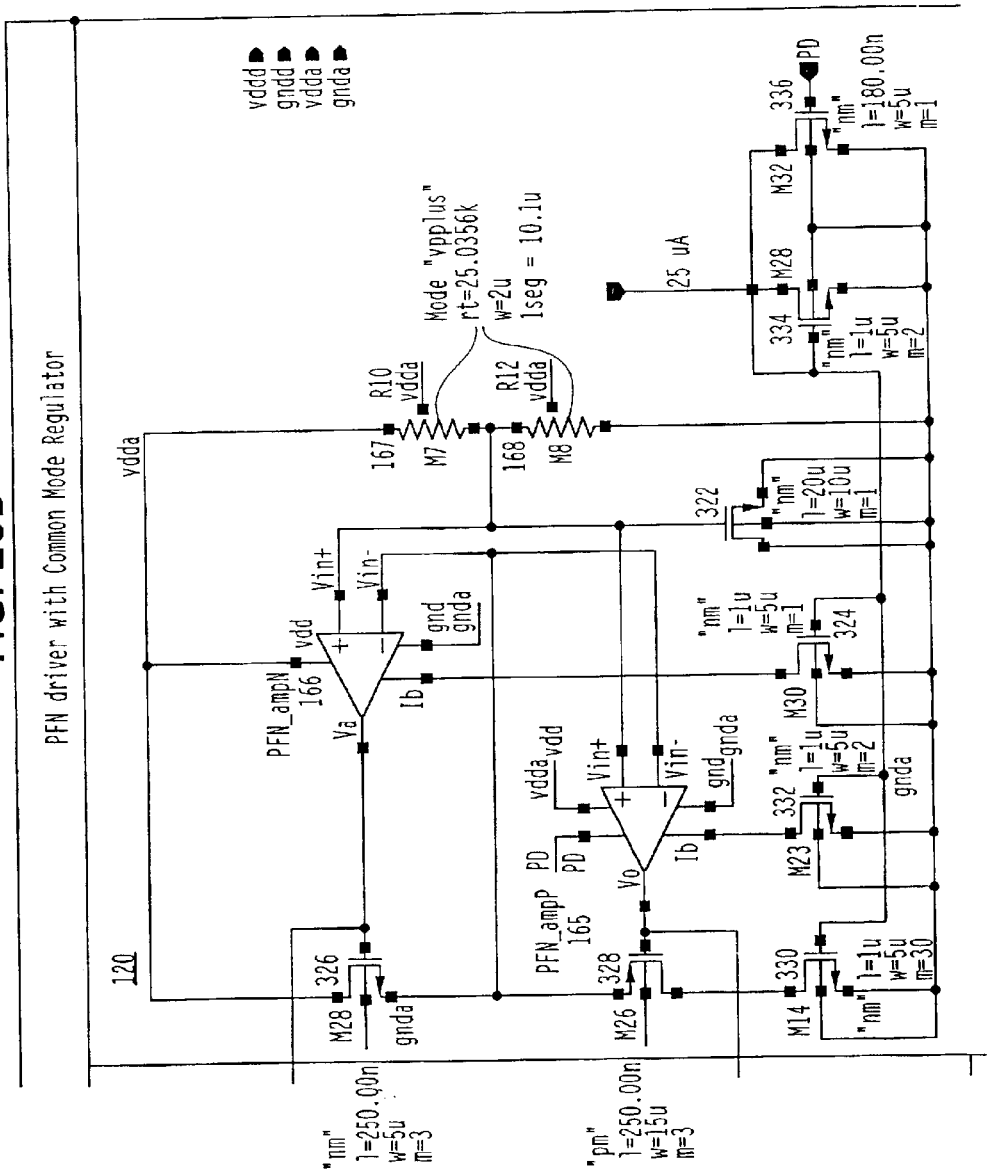

Referring now to FIG. 20, switches SW1 and SW4 each comprise a p-MOS transistor, whereas switches SW2 and SW3 each comprise an n-MOS transistor. As explained in greater detail herein below, switch SW1 shown in FIG. 20 corresponds to pMOS transistor 300 shown in FIG. 28; switch SW2 shown in FIG. 20 corresponds to nMOS transistor 302 shown in FIG. 28; switch SW3 shown in FIG. 20 corresponds to nMOS transistor 304 shown in FIG. 28; and switch SW4 shown in FIG. 20 corresponds to pMOS transistor 306 shown in FIG. 28. Moreover, transistors 318 (corresponds to SFP in FIG. 20) and 320 (corresponds to SFN in FIG. 20) shown in FIG. 28 are similar in function to resistors R1 and R2 shown in FIG. 17.

OUTPUT is either the positive mono-cycle 100 or the negative mono-cycle 102, and is transmitted either off-chip to an antenna (not shown in FIG. 20) which comprises a 50-ohm load, or to an internal load, such as a mixer, which is a high-impedance load to which OUTPUT is matched. Switches SW1, SW2, SW3, and SW4, and common mode buffer 120, are sized to provide the required drive impedance to the load.

Although not shown in FIG. 20, the gates of the transistors corresponding to switches SW1, SW2, SW3, and SW4 are tied to timing pulses which close or open the switches in proper sequence.

Also shown in FIG. 20 is common mode buffer 120. When the drivers of circuit 119 are not gated, then the common mode buffer 120 brings the output voltage OUTPUT to a common mode voltage as quickly as possible. The common mode buffer 120 drives transistors SFN and SFP as shown, using amplifiers 150, 152, which are also tied to Vref. Vref is equal to VDD/2. Common mode buffer 120 brings OUTPUT to the midlevel as quickly as possible, using little power.

Figure 21:
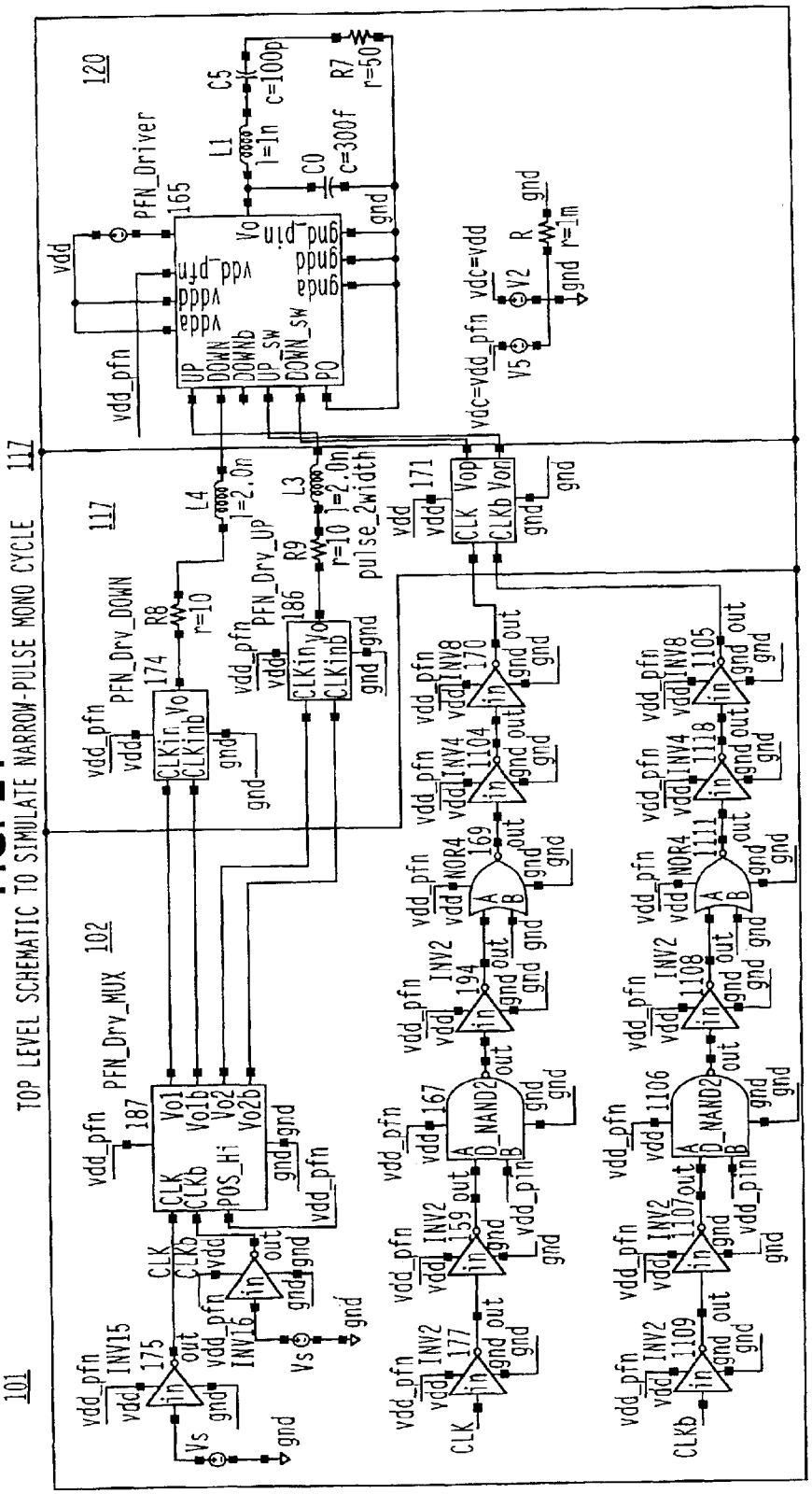
FIG. 21 is a top-level schematic diagram of a circuit 101 shown in FIG. 12.

FIG. 21 is a top-level schematic diagram of a circuit 101 shown in FIG. 12. As shown in FIG. 21, multiplexer 102 comprises inverters 175, 176 respectively inputting CLK and CLKb to PFN-Driver-Mux 187. PFN-Driver-Mux 187 then outputs Vo1, Vo1b, Vo2, and Vo2b. Vo1 corresponds to CLK1, Vo1b corresponds to CLK1b, Vo2 corresponds to CLK2, and Vo2b corresponds to CLK2b shown in FIG. 12. Whether a positive or a negative mono-cycle is to be generated is defined by input 'POS_Hi' to PFN_Drv_Mux 187. This signal corresponds to DATA/DATAbar in FIG. 12 and controls PFN_Drv_Mux to output signals CLK1 CLK1b CLK2 and CLK2b appropriate for a positive mono-cycle when 'high'. FIG. 21 shows this input set to 'vdd_pfn', a power signal set to Vdd thereby defining positive mono-cycle generation. Throughout, PFN refers to Pulse Forming Network.

In addition, CLK and CLKb are also input to delay circuits, the outputs of which are input to Pulse-2Width circuit 171 as CLK and CLKb, respectively. These delay circuits are copies of the circuitry in PFN_Drv_Mux 187 to maintain signal timing between the two different paths CLK and CLKb take to provide signals to PFN_Driver 120.

The delay circuits of FIG. 21 are now explained. CLK is input to inverter 177. The output of inverter 177 is input to inverter 159. The output of inverter 159 then drives NAND gate 167. Another input of NAND gate 167 is vdd_pfn, a logic high signal which makes the NAND gate 167 function as an inverter to the CLK signal path in order to maintain tracking delay for the CLK path signal through this path and that through PFN_Drv_Mux path as mentioned above. The output of NAND gate 167 is then input to inverter 194, the output of which is input to NOR gate 169. The other input to NOR gate 169 is set to gnd again allowing the main signal from CLK to propogate through with matching delays as those seen through PFN_Drv_Mux to maintain signal alignment when they converge at PFN_Driver 120. The output of NOR gate 169 is then input to inverter 1104, the output of which is input to inverter 170. The output of inverter 170 is input to Pulse-2Width circuit 171 as CLK.

CLKb is input to inverter 1109. The output of inverter 1109 is input to inverter 1107. The output of inverter 1107 then drives NAND gate 1106. Another input to NAND gate 1106 is vdd_pfn, as discussed herein above. The output of NAND gate 1106 is input to inverter 1108, the output of which is input to NOR gate 1111. Another input to NOR gate 1111 is set to gnd as discussed above with respect to NOR gate 169. The output of NOR gate 1111 is input to inverters 1104 and 1105. The output of inverter 1105 is input to Pulse-2Width circuit 171 as CLKb.

Vo1, Vo1b, Vo2, and Vo2b are input to pulse generating circuit 117. More particularly, Vo1 and Vo1b are input to PFN-Driver-Down pulse generating circuit 174 as CLKin and CLKinb, respectively, while Vo2 and Vo2b are input to PFN-Driver-up pulse generating circuit 186 as CLKin and CLKinb, respectively. PFN-Driver-Down pulse generating circuit then outputs Vo through resistor R8 and inductor L4 in 117 to PFN-Driver circuit 165 as input DOWN. Moreover, PFN-Driver-Up pulse generating circuit 186 outputs Vo to PFN-Driver circuit 165 through resistor R9 and inductor L3 as input UP. PFN-Driver-Down pulse generating circuit 174 and PFN-Driver-Up pulse generating circuit 186 correspond to switches 1 and 2 shown in FIG. 17.

Pulse-2Width circuit 171 corresponds to switches 3 and 4 shown in FIG. 17. The output of Pulse-2Width circuit 171, Vop and Von, is input to PFN-Driver circuit 165 as Up-sw, and Down-sw, respectively.

PFN-Driver circuit 165 in 120, FIG. 21, also receives as inputvdd_pfn, as explained herein above. The output Vo, corresponding to OUTPUT of FIG. 12, is coupled to Ground through capacitor C0, and through inductor L1, capacitor C5, and resistor R7 . Capacitor C0 and inductor L1 represent parasitic elements inherent in the path the signal must take through the physical medum from circuit PFN_Driver 165 to the antenna load, here represented as resistor R7. C5 is a de-coupling capacitor for DC.

PFN_Driver 165 shown in FIG. 21 is explained in further detail with reference to FIG. 28.

Figure 22:
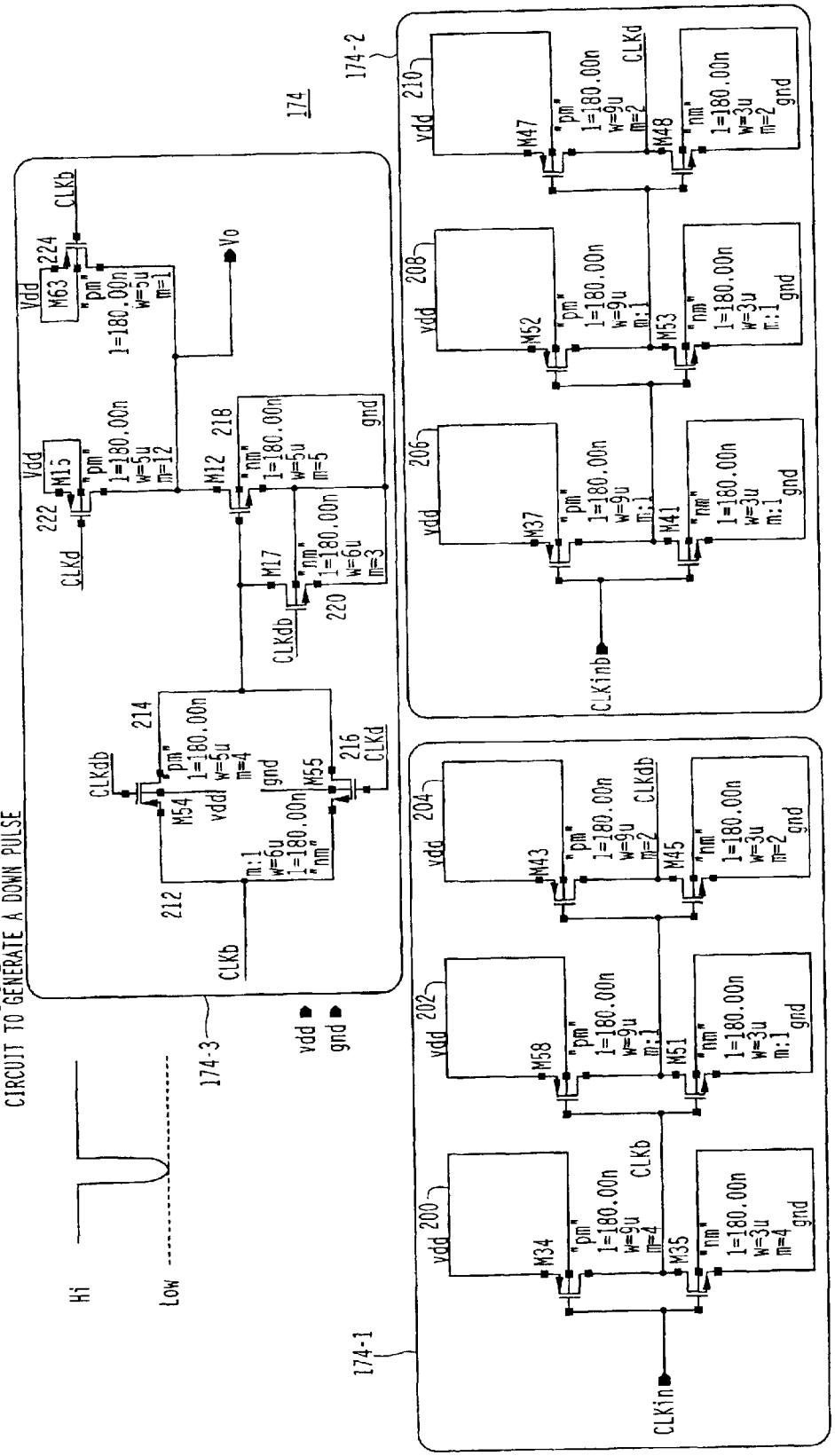
FIG. 22 shows a circuit diagram of PFN (Pulse Forming Network)-Driver-Down pulse generating circuit 174.

FIG. 22 shows a circuit diagram of PFN-Driver-Down pulse generating circuit 174, which receives as input differential clock signals CLKin and CLKinb and which comprises a fast NAND gate 174-3.

As shown in FIG. 22, CLKin is received by circuit 174-1 by inverter 200, which outputs CLKb. CLKb is input into inverter 202, which is coupled in series to inverter 204. Inverter 204 then outputs CLKbd, a delayed waveform of CLKb.

Likewise, CLKinb is input to circuit 174-2 to inverter 206, which is coupled in series with inverters 208 and 210, the output of which is CLKd. For the transistors of inverters 200, 202, 204, 206, 208, and 210, sizing is important. Each of the inverters 200, 202, 204, 206, 208, and 210 comprises complementary PMOS and NMOS transistors sized so that each transistor is as small as possible since the delay through inverters 200, 202, 204, 206, 208, and 210 determines the size of the pulse with of the output mono-cycle.

CLKb is then input to NAND gate 174-3, which is a NAND gate modified as compared to that of FIG. 3. More particularly, CLKb is input to switch (or transmission gate) 212. Switch 212, a transmission gate, includes complementary NMOS and PMOS transistors coupled in parallel with each other. That is, CLKdb is input to the gate of PMOS transistor, while CLK is input to the gate of NMOS transistor 216, while the sources of each of PMOS transistor 214 and NMOS transistor 216 are coupled to CLKb. The drains of each of PMOS transistor 214 and NMOS transistor 216 are coupled together and are input to the gate of NMOS transistor 218 and to the drain of NMOS transistor 220. The gate of NMOS transistor 220 is coupled to CLKdb. The sources of both NMOS transistor 218 and NMOS transistor 220 are coupled to Ground (gnd).

The drain of NMOS transistor 218 is coupled to the drain of PMOS transistor 222, which receives as input CLKd. The drain of PMOS transistor 222 is also coupled to the drain of PMOS transistor 224, the gate of which is coupled to CLKb.

As shown in FIG. 22, when CLKin goes low (logic "0"), then CLKb goes high (logic "1") while switch 212 is still on and transfers a logic "1" to the output of switch 212. That is while CLKd is high transistor 216 is on and while CLKdb is low transistor 214 is on, then CLKb propagates from the input through switch 212. Also, when CLKb goes high transistor 224 turns off releasing the output node Vo from being held at Vdd. The logic "1" signal CLKb propagates through switch 212, turns on transistor 218, which pulls Vo low.

A short time later, the signals falling CLKin and rising CLKinb propagate to change CLKd to low and CLKdb to high. These signals turn off switch 212, removing the logic "1" signal from the gate of transistor 218 (which had pulled Vo low). At the same time, the now high CLKdb turns on transistor 220, which pulls the gate of transistor 218 to ground, turning off transistor 218 while the now low CLKd turns on transistor 222, which pulls Vo to Vdd. This combination of switches and delayed clocks produce a narrow pulse that starts high, pulls low momentarily, then returns high.

Figure 23A:
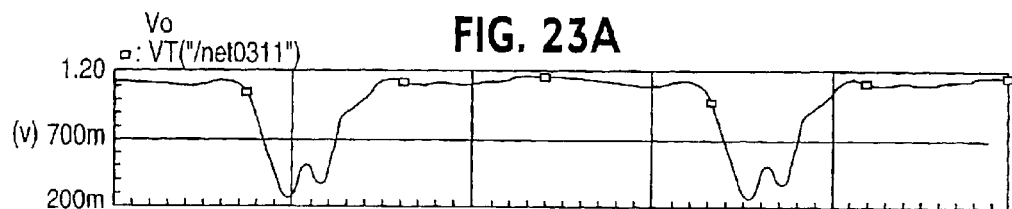
FIGS. 23A through 23E are timing diagrams corresponding to the circuit diagram 171 of FIG. 22.
Figure 23B:
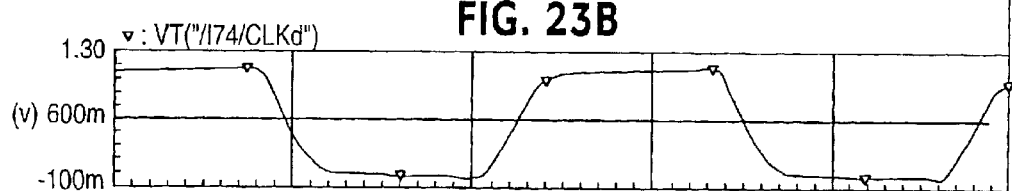
Figure 23C:
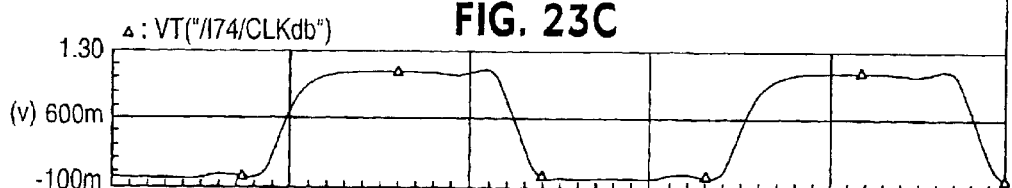
Figure 23D:
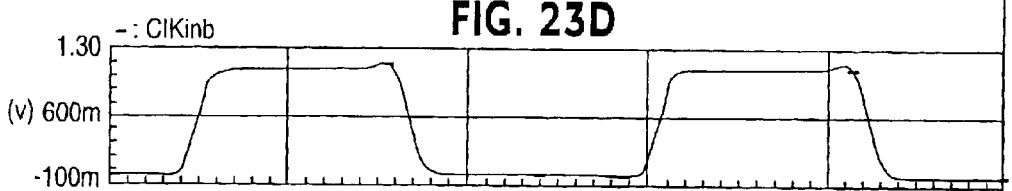
Figure 23E:
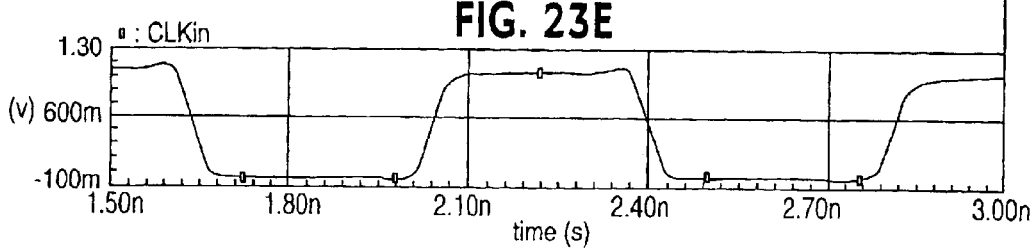

FIGS. 23A through 23E are timing diagrams corresponding to the circuit diagram 171 of FIG. 22. More particularly, FIG. 23A shows the down pulse, Vo, generated by the circuit diagram of FIG. 22. FIG. 23B shows CLKd; FIG. 23C shows CLKdb; FIG. 23D shows CLKinb; and FIG. 23E shows CLKin. As shown in FIGS. 23A–E, CLKin has a period of approximately 0.78 ns (nanoseconds). The leading edge of the down pulse Vo generated by the circuit of FIG. 22 corresponds to the leading edge of the down pulse of CLKd.

Figure 24:
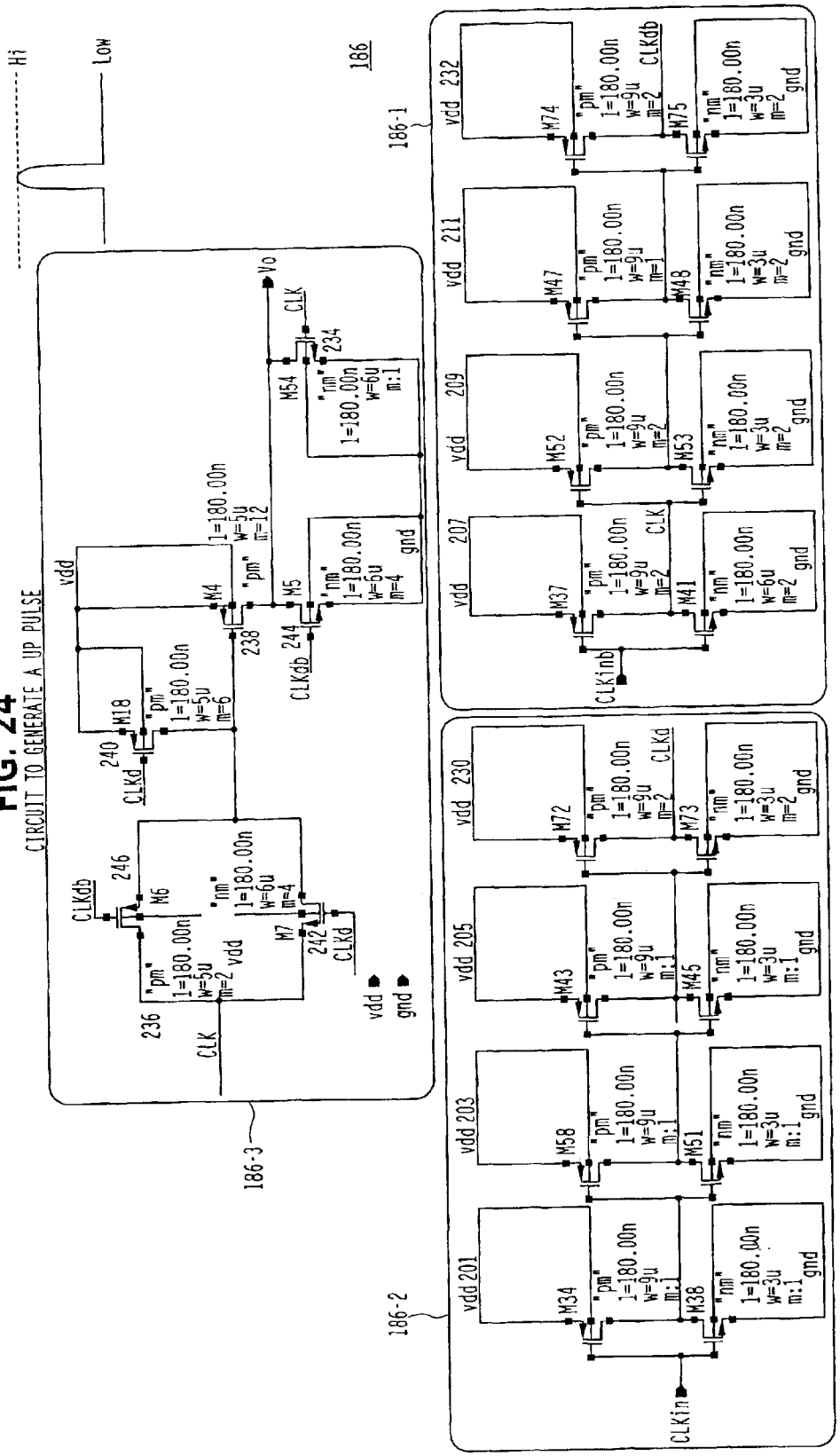
FIG. 24 shows a circuit diagram of PFN-Driver-Up pulse generating circuit 186 shown in FIG. 21.

FIG. 24 shows a circuit diagram of PFN-Driver-Up pulse generating circuit 186 shown in FIG. 21. More particularly, FIG. 24 comprises a circuit 186 to generate an up pulse of the present invention. The circuit 186 of FIG. 24 comprises a fast NOR gate 186-3 and includes inverter strings 186-1 and 186-2, including inverters 201, 203, 205, 207, 209, and 211, each comprising complementary sets of NMOS and PMOS transistors, and also inverters 230 and 232. Inverters 230 and 232 also comprise complementary sets of PMOS and NMOS transistors. Inverter 230 is coupled in series to inverter 205, while inverter 232 is coupled in series to inverter 211. Thus, CLKin is input to the inverter string comprising inverters 201, 203, 205, and 230 coupled in series with each other, the output of which is CLKd. That is, CLKin and CLKd are in-phase with each other, but CLKd is delayed in time from CLKin, in passing through inverters 201, 203, 205, and 230. That is, if CLKin is low, then CLKd is also low after a delay due to the signal propagating through the inverter strings.

Moreover, CLKinb is input to the inverter string comprising inverters 207, 209, 211, and 232 coupled in series with each other, the output of which is CLKdb. That is, CLKb and CLKdb are in-phase with each other, and 180 degrees out of phase with CLKin and CLKinb, respectively, but CLKdb is delayed in time from CKLd in passing through inverters 207, 209, 211, and 232. That is, if CLKinb is high, then CLKdb is also high after a delay due to the signal propagating through the inverter strings.

Referring again to FIG. 24, if CLKinb is low and has been low longer than the inverter string delay time, then CLK is high and so is CLKd. As CLKin is CLKinb inverted, CLKin is high and CLKd is high. This condition for CLKd and CLKdb turns on switch 236 so that signal CLK (high) is applied to the gate of PMOS 238 turning it off. CLKd high turns off PMOS 240, CLKdb turns off NMOS 244, while CLK turns on NMOS 234. This combination results in Vo being pulled low through NMOS 234.

To pull Vo high, CLKin goes low and CLKinb goes high. The first node to respond is CLK which goes low making NMOS 234 go off. Switch 236 is initially on as CLKd has not changed from high to low, and CLKdb similarly holds PMOS 246 on. Signal CLK propagates through switch 236 to turn on PMOS 238, pulling Vo high at the same time that CLK going low turns off NMOS 234.

Vo goes high as the CLKin and CLKinb edges propagate through the inverter string, finally causing CLKd to go low and CLKdb to go high. At this time defined by the propagation delay time of the inverter chains, switch 236 turns off, PMOS 240 turns on (CLKd going low) which turns off PMOS 238 releasing the pull-up path to Vo. CLKdb going high now tgurns on NMOS 244 which pulls Vo low completing the pulse low-to-high-to-low.

Figure 25A:
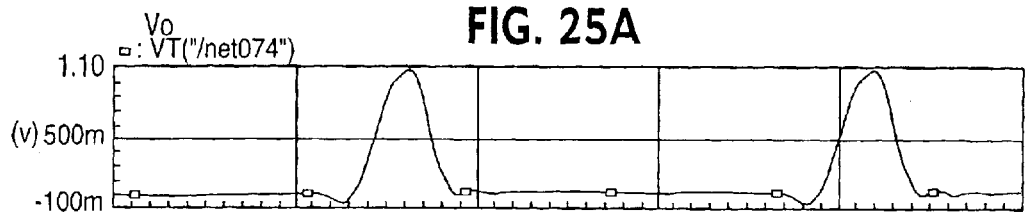
FIGS. 25A through 25E show timing diagrams corresponding to the circuit diagram 186 of FIG. 24.
Figure 25B:
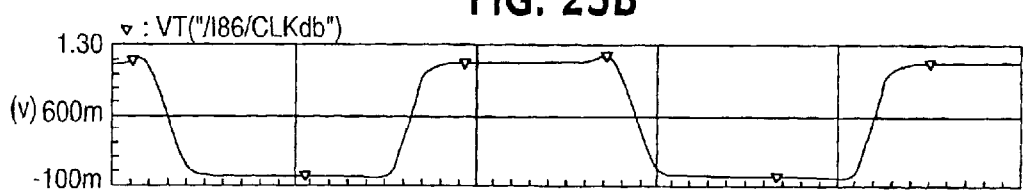
Figure 25C:
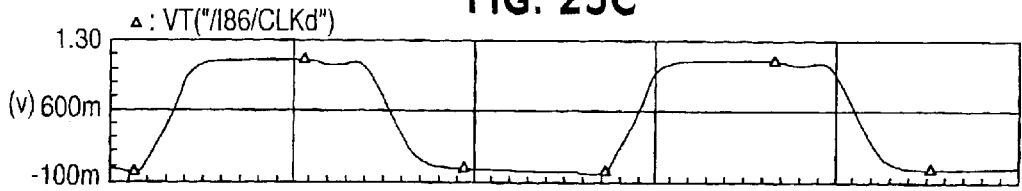
Figure 25D:
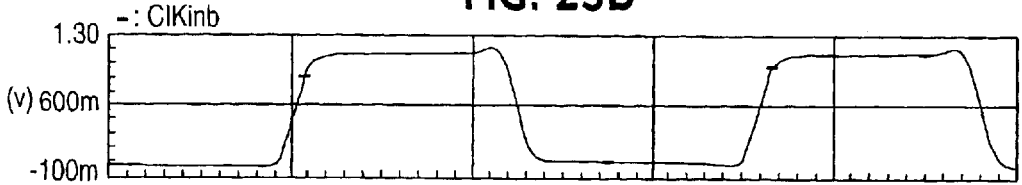
Figure 25E:
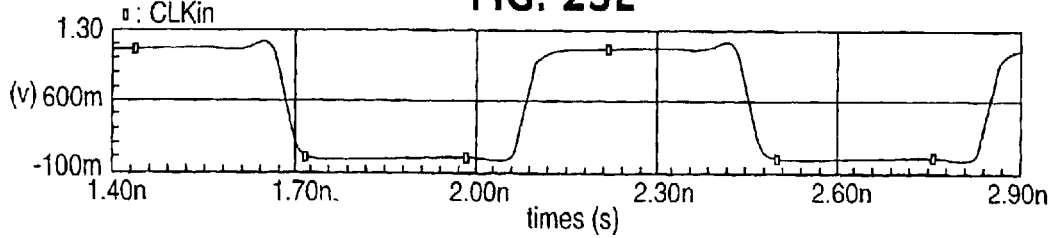

FIGS. 25A through 25E show timing diagrams corresponding to the circuit diagram 186 of FIG. 24. More particularly, FIG. 25A shows a timing diagram of Vo; FIG. 25B shows a timing diagram of CLKdb; FIG. 25C shows a timing diagram of CLKd; FIG. 25D shows a timing diagram of CLKinb; and FIG. 25E shows a timing diagram of CLKin. As shown in FIGS. 25A through 25E, the falling edge of CLKin initiates generating the up-pulse Vo, whereas the rising edge of CLKdb initiates the return of Vo to logical "0".

Figure 26:
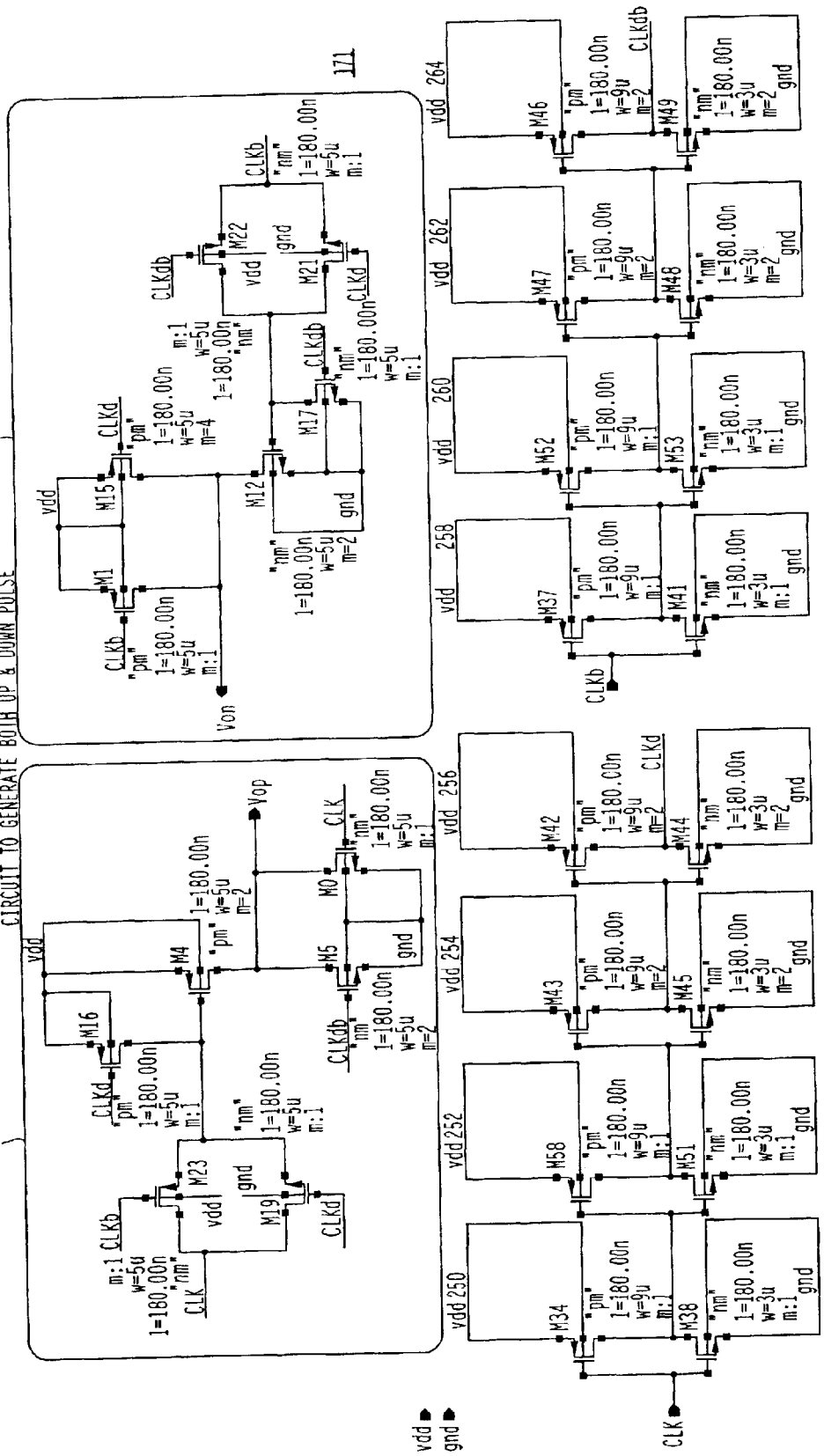
FIG. 26 shows a diagram of the two pulse generating circuits up and down shown in FIG. 21.

FIG. 26 shows a diagram of pulse-2width circuit 171 shown in FIG. 21. Pulse-2width circuit 171 includes NOR gate 171-1 and NAND gate 171-2, as well as inverters as explained. While PFN-Driver-Down pulse generating circuit 174 and PFN-Driver-Up pulse generating circuit 186 generate up-pulses and down-pulses, respectively, for both switches 1 and 2 shown in FIG. 17, Pulse-2width circuit 171 generates both up and down pulses for both switches 3 and 4 shown in FIG. 17. As shown in FIG. 26, Pulse-2Wdith circuit 171 includes inverters 250, 252, 254, and 256 coupled in series with each other, each of the inverters 250, 252, 254, and 256 comprising complementary sets of NMOS and PMOS transistors. Also as shown in FIG. 26, Pulse-2Wdith circuit 171 includes inverters 258, 260, 262, and 264 coupled in series with each other, each of the inverters 258, 260, 262, and 264 comprising complementary sets of NMOS and PMOS transistors.

Referring again to FIG. 26, CLK is input to the series of inverters comprising inverters 250, 252, 254, and 256, the output of which is CLKd. In contrast, CLKb is input to the series of inverters comprising inverters 258, 260, 262, and 264, the output of which is CLKdb.

In addition to the foregoing inverters, Pulse-2Width circuit 171 includes a transistor circuit generating Von, and a transistor circuit generating Vop.

FIG. 26 is a combination of FIGS. 24 and 22, which include a fast NAND gate and a fast NOR gate. That is, the circuits shown in FIG. 26 are the same circuits as in FIG. 22 down pulse and FIG. 24 up pulse, where the clock delay chains are shared by both. Vop signal is the up pulse, and Von the down pulse.

Figure 27A:
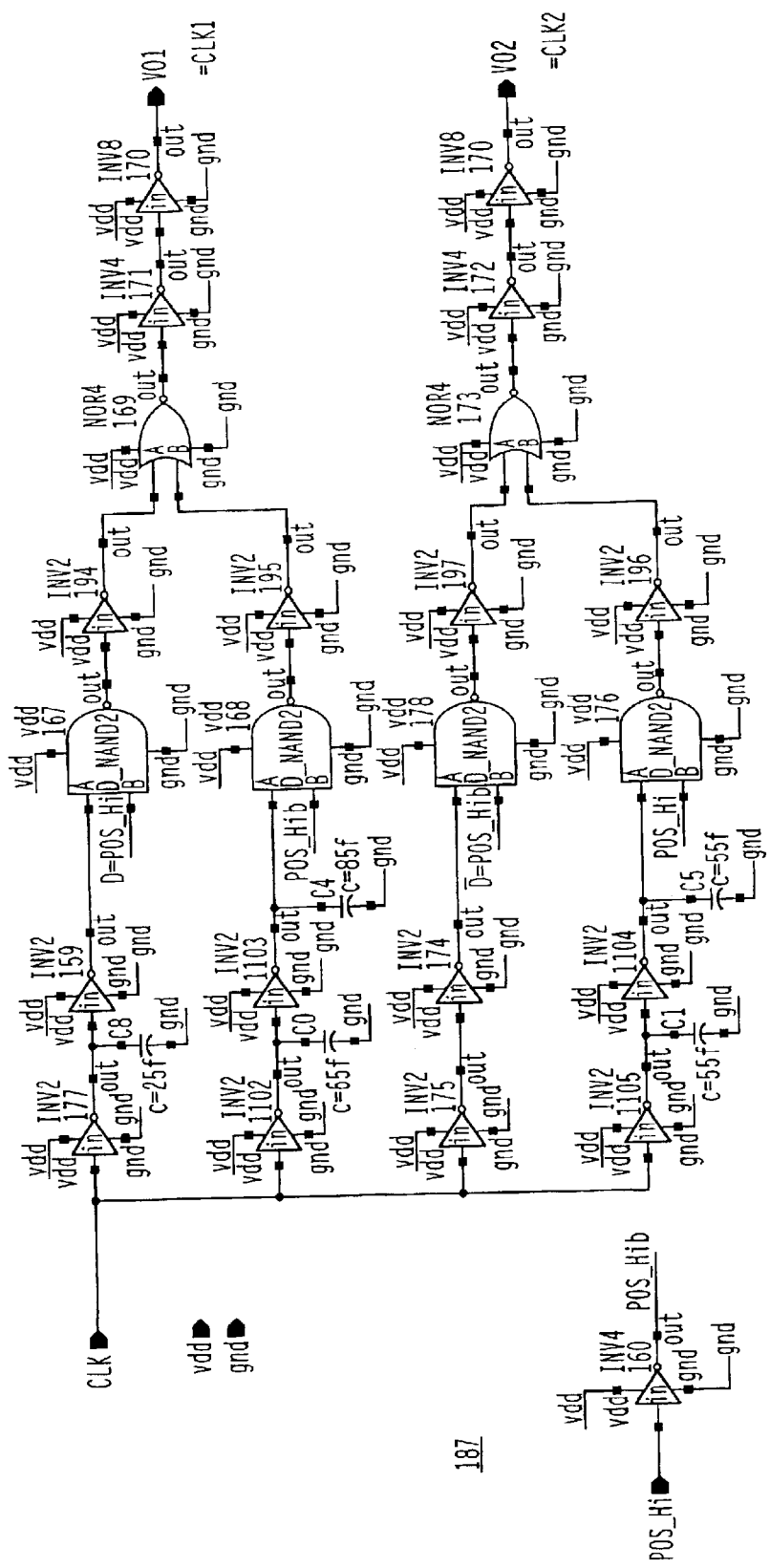
FIG. 27 is a circuit diagram of PFN-Driver-Mux 187 shown in FIG. 21.
Figure 27B:
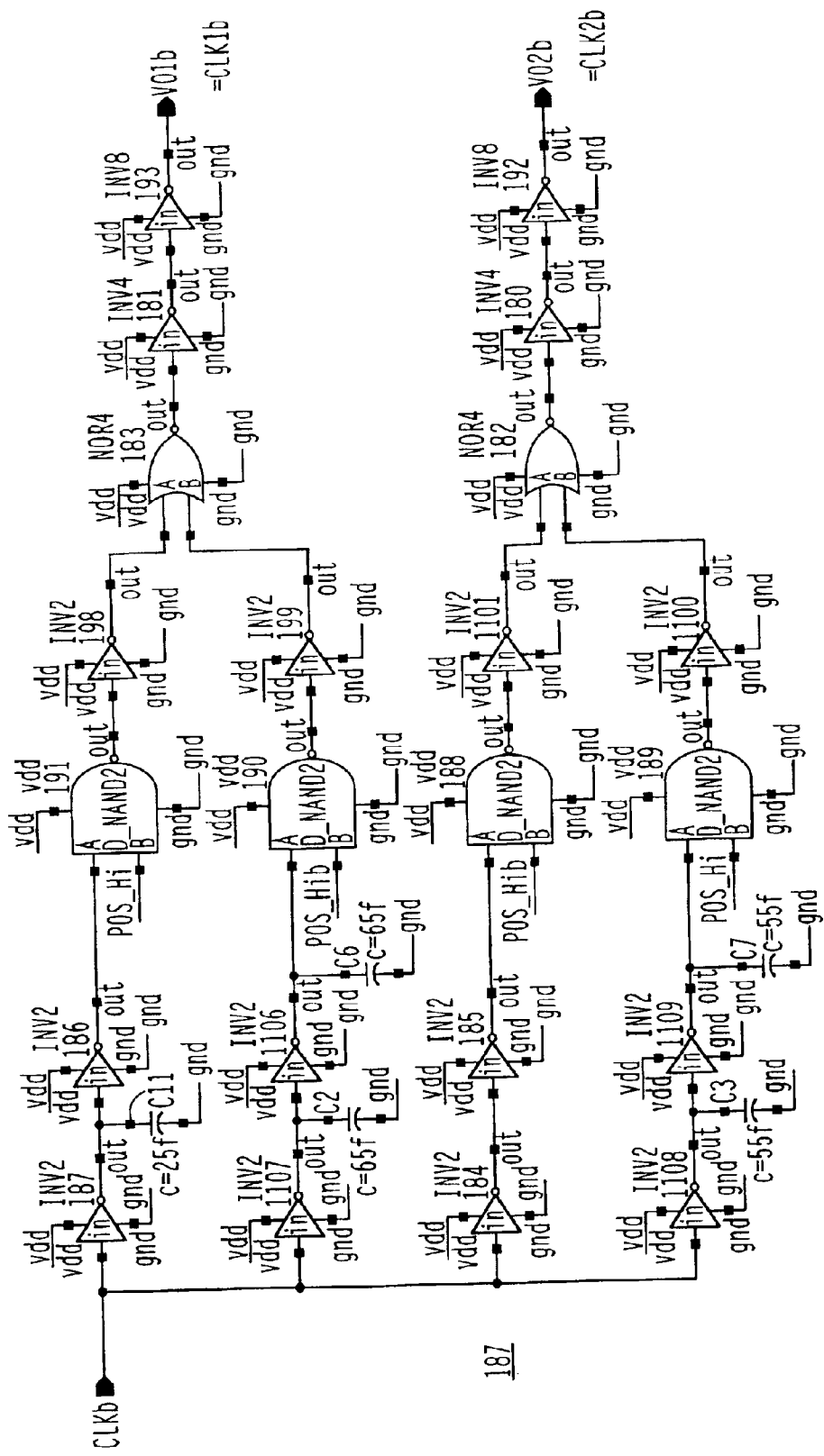

FIG. 27 is a circuit diagram of PFN-Driver-Mux 187 shown in FIG. 21. As shown in FIG. 27, the PFN-Driver-Mux 187 receives as input CLK and CLKb, and produces as outputs Vo1 (CLK1), Vo2 (CLK2), Vo1b (CLK1b), and Vo2b (CKL2b). In addition, PFN-Driver-Mux 187 receives as inputs POS_Hi (DATA) and POS_Hib (DATAb), which determines whether to generate a positive mono-cycle (if POS_Hi is asserted) or a negative mono-cycle (if POS_Hib is asserted). More particularly, based upon whether POS_Hi is asserted or POS_Hib is asserted, then PFN-Driver-Mux 187 determines whether CLK1 will be asserted prior in time to CLK2, or whether CLK2 will be asserted prior in time to CLK1.

After being received by PFN-Driver-Mux 187, CLK is transmitted through inverter 177 and inverter 159, the output of which is NANDed with POS_Hi in NAND gate 167. Inverter 177 and inverter 159 are coupled to each other in series, with the output of inverter 177 being coupled to ground (GND) through capacitor C8. The output of NAND gate 167 is then input to inverter 194, the output of which forms one input to NOR gate 169. This pathway injects no delay into NAND 167 and generates the input to NOR gate 169 which results in CLK1 preceding CLK2 in time.

CLK is also input to inverter 1102, the output of which is tied to ground through capacitor C0 and to the input terminal of inverter 1103. The output of inverter 1103 is tied to ground through capacitor C4 and also forms one input to NAND gate 168. The other input to NAND gate 168 is POS_Hib. The resultant output of NAND gate 168 is input to inverter 195, the output of which forms the other input to NOR gate 169. This pathway injects a delay into NAND 168.

The resultant output of NOR gate 169 is input to inverter 171, which is input to inverter 170, the output of which is Vo1 (CLK1).

In addition, after being received by PFN-Driver-Mux 187, CLK is transmitted through inverter 175 and inverter 174, the output of which is NANDed with POS_Hib in NAND gate 178. Inverter 175 and inverter 174 are coupled to each other in series. The output of NAND gate 178 is then input to inverter 197, the output of which forms one input to NOR gate 173. This pathway injects no delay into NAND 178 and generates the input to NOR gate 173 which results in CLK2 preceding CLK1 in time.

CLK is also input to inverter 1105, the output of which is tied to ground through capacitor C1 and to the input terminal of inverter 1104. The output of inverter 1104 is tied to ground through capacitor C5 and also forms one input to NAND gate 176. The other input to NAND gate 176 is POS_Hi. The resultant output of NAND gate 176 is input to inverter 196, the output of which forms the other input to NOR gate 173. This pathway injects a delay into NAND 176.

The resultant output of NOR gate 173 is input to inverter 172, which is input to inverter 179, the output of which is Vo2 (CLK2).

After being received by PFN-Driver-Mux 187, CLKb is transmitted through-inverter 187 and inverter 186, the output of which is NANDed with POS_Hi in NAND gate 191. Inverter 187 and inverter 186 are coupled to each other in series, with the output of inverter 187 being coupled to ground (GND) through capacitor C11. The output of NAND gate 191 is then input to inverter 198, the output of which forms one input to NOR gate 183. This pathway injects no delay into NAND 191 and generates the input to NOR gate 183 which results in CLKb1 preceding CLKb2 in time.

CLKb is also input to inverter 1107, the output of which is tied to ground through capacitor C2 and to the input terminal of inverter 1106. The output of inverter 1106 is tied to ground through capacitor C6 and also forms one input to NAND gate 190. The other input to NAND gate 190 is POS_Hib. The resultant output of NAND gate 190 is input to inverter 199, the output of which forms the other input to NOR gate 183. This pathway injects a delay into NAND 190.

The resultant output of NOR gate 183 is input to inverter 181, which is input to inverter 193, the output of which is Vo1 (CLKb1).

In addition, after being received by PFN-Driver-Mux 187, CLKb is transmitted through inverter 184 and inverter 185, the output of which is NANDed with POS_Hib in NAND gate 188. Inverter 184 and inverter 185 are coupled to each other in series. The output of NAND gate 188 is then input to inverter 1101, the output of which forms one input to NOR gate 182. This pathway injects no delay into NAND 188 and generates the input to NOR gate 182 which results in CLKb2 preceding CLKb1 in time.

CLKb is also input to inverter 1108, the output of which is tied to ground through capacitor C3 and to the input terminal of inverter 1109. The output of inverter 1109 is tied to ground through capacitor C7 and also forms one input to NAND gate 189. The other input to NAND gate 189 is POS_Hi. The resultant output of NAND gate 189 is input to inverter 1100, the output of which forms the other input to NOR gate 182. This pathway injects a delay into NADN 189.

The resultant output of NOR gate 182 is input to inverter 180, which is input to inverter 192, the output of which is Vo2 (CLKb2).

FIG. 28 shows a PFN driver with common mode regulator circuit (or PFN-Driver circuit) 165 shown in FIG. 21. PFN-Driver circuit 165 reduces the current dissipation and the noise of 171 and 186. Moreover, PFN-Driver circuit 165 shown in FIG. 28 comprises the switch circuit 119 and the common mode buffer circuit 120 shown in FIG. 20.

Referring now to FIG. 28, switch circuit 119 includes switches SW1, SW2, SW3, and SW4. Switch SW1 comprises PMOS transistor 300; switch SW2 comprises NMOS transistor 302; switch SW3 comprises NMOS transistor 304; and switch SW4 comprises PMOS transistor 306. Switch SW1 is coupled to Vdd. More particularly, the drain of transistor 300 (switch SW1) is coupled to Vo (OUTPUT of FIG. 20) and to the drain of transistor 302 (switch SW2). The gate of transistor 300 is coupled to input signal DOWN through capacitor c4. The gate of transistor 300 is also coupled to the gate of PMOS transistor 314 through resistor R0. The gate of transistor 314 is coupled to Vdd through capacitor C1 and to the drain of transistor 314. More particularly, transistors 300 and 314 form a current mirror, with the current flowing from the drain of transistor 300 mirroring the current flowing from the drain of transistor 314 through resistor R2. Due to the connection gate-to-drain of transistor 314, resistor R2, and transistor 316 also connected drain-to-gate short, the gate voltage of transistor 300 is sent to approximately a PMOS threshold below Vdd, approximately equal to Vdd-0.4 Volts.

While the drain of transistor 302 is coupled to the drain of transistor 300, the gate of transistor 302 is coupled to the input signal UP through capacitor C5, to the gate of transistor 316 through resistor R1, to the drain of transistor 316 through resistor R1, and to ground through resistor R1 and capacitor C0. Transistors 302 and 316 also form a current mirror with each other. The source of transistor 316 is coupled to ground.

In addition, switches SW1 and SW2 form an AC coupling with each other. Moreover, because of the current mirror between transistors 302 and 316, the voltage at the gate of transistor 302 is at approximately at an NMOS threshold above groun equal to about +0.4 V.

Referring again to FIG. 28, the source of switch SW4 (transistor 306) is coupled to Vdd, while the gate of SW4 is coupled to signal DOWN_sw. The drain of SW4 is coupled to the drain of NMOS transistor 318, the source of which is coupled to Vo and to the source of PMOS transistor 320. The drain of transistor 320 is coupled to the drain of switch SW3. The gate of switch SW3 is coupled to the input signal UP_sw, while the source of switch SW3 is coupled to ground.

Referring again to FIG. 28, common mode buffer circuit 120 includes PFN_ampN 166 and PFN_ampP 165. The Vin−terminal of PFN_ampN 166 is coupled to the Vin− terminal of PFN_ampP 165. The Vin+terminals of both PFN_ampN 166 and PFN_ampP 165 are coupled to each other, to Vdd through resistor R10, to ground through resistor R12, and to the gate of NMOS transistor 322, the drain and source of which are coupled to ground. PFN_ ampN 166 is also coupled to Vdd, to ground, and to the drain of NMOS transistor 324, the source of which is coupled to ground. The output Vo of PFN_ampN 166 is coupled to the gate of NMOS transistor 326, the drain of which is coupled to Vdd and the source of which is coupled to Vin-of PFN_ampN 166 and PFN_ampP 165. The source of transistor 326 is also coupled to the source of PMOS transistor 328, the gate of which is coupled to the output Vo of PFN_amp P165, and the drain of which is coupled to the drain of NMOS transistor 330, the gate of which is coupled to the gate of transistor 334.

The gate of transistor 326 is coupled to the gate of transistor 318, thus forming a mirror copy. The gate of transistor 328 is coupled to the gate of transistor 320, thus also forming a mirror copy.

PFN_ampP 165 is also coupled to PD (power down for turning off cells), to Vdd, to ground, and to the drain of NMOS transistor 332, the source of which is coupled to ground and the gate of which is coupled to the gate of transistor 334. The gate transistor 324 is also coupled to the gate of NMOS transistor 334, to Ib (which is an externally-supplied bias current for the amplifier), to the drain of transistor 334, and to the drain of NMOS transistor 336. The gate of transistor 336 is coupled to PD, and the sources of each of transistors 334 and 336 are coupled to ground.

C4 and C5 shown in FIG. 28 couple the UP pulse generated by the fast NOR gate in FIG. 22 212 and the DOWN pulse generated by the fast NAND gate 186 in FIG. 24.

In conventional systems, for an NMOS transistor, Vthreshold~0.4 volts, and a voltage above 0.4 volts turns the NMOS transistor on, while a voltage below 0.4 volts turns the NMOS transistor off. Therefore, in conventional transmitters generating a mono-cycle, approximately 0.4 volts of potential gate signal applied to the output driver transistors is lost on either side of either the up-pulse or the down-pulse, as shown in FIG. 29A using an up-pulse as an example. In general, the higher the up (or down) pulse in voltage, switch SW2 (or SW1) can be turned on (or off) faster and stronger. FIG. 29A shows the amount of up pulse (for example) that is actually turning on SW2, and the amount of voltage lost VL, without AC coupling.

As explained with reference to FIG. 28, the present invention uses an AC coupling between switches SW1 and SW2 and between switches SW3 and SW4, thus using the entire up-pulse (or down-pulse) to turn the switches on or off, thus generating a short pulse and making the switch circuit 119 faster.

FIG. 29B shows that the voltage of the up pulse V1 is greater with AC coupling than would be the voltage of pulse Vo without AC coupling, thus turning on SW2 faster.

Figure 30A:
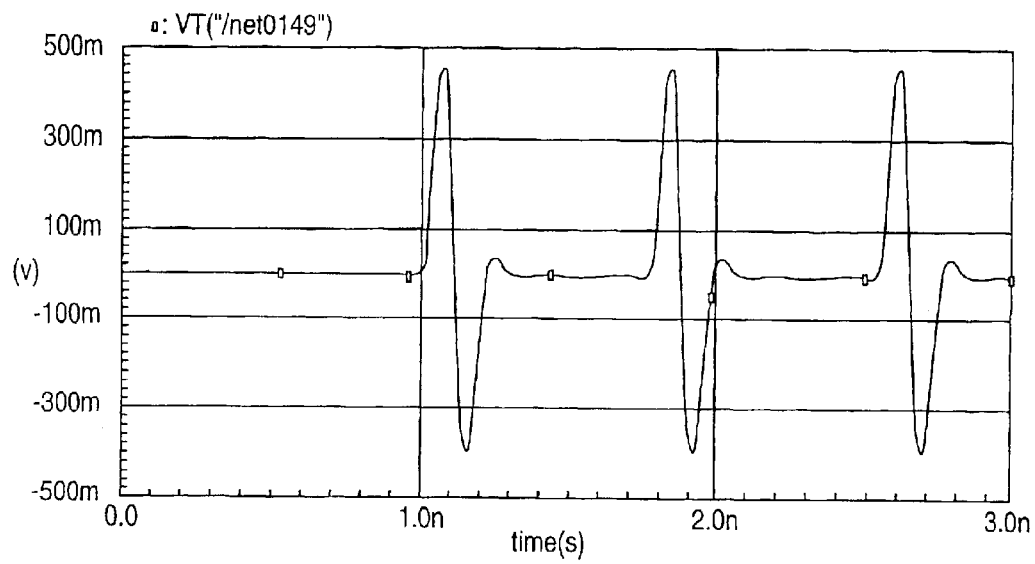
FIGS. 30A and 30B show a narrow-pulse-width mono-cycle generated by the present invention.
Figure 30B:
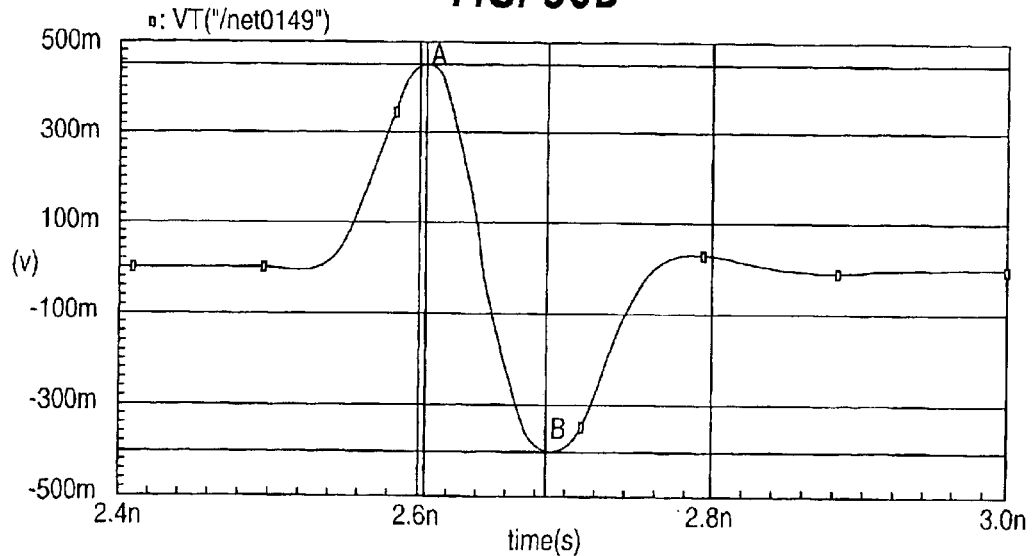

FIGS. 30A and 30B show a narrow-pulse-width mono-cycle generated by the present invention. More particularly, FIGS. 30A and 30B show a positive mono-cycle having a period of approximately 0.7 ns (nanoseconds), and ranging between approximately 480 millivolts (m) and −460 millivolts (m), peak-to-peak.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A mono-cycle generating circuit comprising:
   a multiplexer receiving data, determining whether to generate a positive mono-cycle or a negative mono-cycle, based upon the data, and outputting clock signals;
   a pulse generating circuit, coupled to the multiplexer, receiving the clock signals and generating a first series of pulses comprising an up-pulse preceding a down-pulse, or a second series of pulses comprising a down-pulse preceding an up-pulse, in response to the clock signals received by the multiplexer; and
   a buffer circuit, coupled to the pulse generating circuit, comprising:
      a switch circuit generating the positive mono-cycle or the negative mono-cycle, based upon whether the first series of pulses is received from the pulse generating circuit or the second series of pulses is received from the pulse generating circuit, and
      a common mode buffer circuit coupled to the switching circuit and reducing noise generated by the switch circuit.

2. The mono-cycle generating circuit as in claim 1, wherein the multiplexer outputs the clock signals having delay or no delay, based upon the data.

3. The mono-cycle generating circuit as in claim 1, wherein the pulse generating circuit comprises complementary sets of transistors generating the up-pulse and the down-pulse.

4. The mono-cycle generating circuit as in claim 1, wherein the switch circuit comprises:
   a first switch comprising a PMOS transistor coupled to a source vottage,
   a second switch comprising an NMOS transistor coupled to the first switch through an AC coupling and to ground,
   a third switch comprising a PMOS transistor coupled to the source voltage, and a fourth switch comprising an NMOS transistor coupled to the third switch and to ground.

5. The mono-cycle generating circuit as in claim 4, wherein the common mode buffer circuit comprises complementary sets of amplifiers, the output of each of which is coupled to she switch circuit.

6. The mono-cycle generating circuit as in claim 5, wherein the third switch is coupled to the fourth switch through a complementary set of transistors, and the gates of each of the transistors of the complementary set of transistors is coupled to the output of respective amplifiers of the common mode buffer circuit.

7. The mono-cycle generating circuit as in claim 6, wherein the respective output of each of the amplifiers is coupled to a gate of a second set of complementary transistors, and each set of complementary transistors forms mirror copies.

8. The mono-cycle generating circuit as in claim 1, said multiplexer generating the first series of pulses and the second series of pulses by interjecting delay into clock pulses received by the multiplexer circuit.

9. The mono-cycle generating circuit as in claim 1, said pulse generating circuit comprising:
   a NOR gate comprising complementary sets of transistors, and
   a NAND gate comprising complementary sets of transistors.

10. A circuit comprising:
    a multiplexer inputting a differential clock and data and outputting control signals based upon the data;
    a down-pulse generating circuit, coupled to the multiplexer, comprising a NAND gate generating a down-pulse based upon the control signals;

an up-pulse generating circuit, coupled to the multiplexer, comprising a NOR gate generating an up-pulse based upon the control signals;

an up-and-down pulse generating circuit, coupled to the multiplexer, comprising a NAND gate and a NOR gate, and generating an up-pulse and a down-pulse based upon the control signals; and a driver circuit, coupled to the down-pulse generating circuit, to the up-pulse generating circuit, and to the up-and-down pulse generating circuit, generating mono-cycles based upon the up-pulse and the down-pulse.

11. The circuit as in claim 10, wherein the driver circuit generates one of a positive mono-cycle and a negative mono-cycle in response to the data received by the multiplexer.

12. The circuit as in claim 10, said driver circuit comprising:

a switch circuit generating one of a positive mono-cycle and a negative mono-cycle responsive to the control signals, and a common mode buffer, coupled to the switch circuit, reducing current dissipation of the switch circuit.

13. The circuit as in claim 12, wherein the switch circuit comprises current mirrors.

14. The circuit as in claim 12, wherein the switch circuit comprises sets of switches, each set of switches comprising an NMOS and a PMOS transistor coupled to each other through an AC coupling.

15. The circuit as in claim 14, wherein each transistor of one of the sets of transistors forms a current mirror with other transistors, and each transistor of the other of the sets of transistors is coupled to the common mode buffer.

16. The circuit as in claim 15, wherein the common mode buffer comprises amplifiers coupled to the switch circuit.

* * * * *